(12) United States Patent
Dülk

(10) Patent No.: US 12,386,118 B2
(45) Date of Patent: Aug. 12, 2025

(54) WAVELENGTH-STABILIZED BROADBAND LIGHT SOURCE

(71) Applicant: EXALOS AG, Schlieren (CH)

(72) Inventor: Marcus Dülk, Schlieren (CH)

(73) Assignee: EXALOS AG, Schlieren (CH)

( * ) Notice: Subject to any disclaimer, the term of this patent is extended or adjusted under 35 U.S.C. 154(b) by 122 days.

(21) Appl. No.: 18/472,400

(22) Filed: Sep. 22, 2023

(65) Prior Publication Data
US 2024/0118496 A1  Apr. 11, 2024

(30) Foreign Application Priority Data
Sep. 30, 2022  (GB) ..................... 2214448

(51) Int. Cl.
*G01J 3/10* (2006.01)
*G02B 6/122* (2006.01)
(Continued)

(52) U.S. Cl.
CPC ............ *G02B 6/29389* (2013.01); *G01J 3/10* (2013.01); *G02B 6/122* (2013.01); *G02B 6/2706* (2013.01);
(Continued)

(58) Field of Classification Search
CPC ......... G01J 3/10; G02B 6/122; G02B 6/2706; G02B 6/29389; G02B 6/29398;
(Continued)

(56) References Cited

U.S. PATENT DOCUMENTS

| | | | |
|---|---|---|---|
| 6,097,743 A | * | 8/2000 | Alphonse ............. H10H 20/042 372/32 |
| 6,108,086 A | | 8/2000 | Michal |

(Continued)

FOREIGN PATENT DOCUMENTS

| | | |
|---|---|---|
| EP | 2056142 | 5/2009 |
| EP | 3666165 | 6/2020 |

(Continued)

OTHER PUBLICATIONS

H. Chou and S. Ezekiel, Wavelength stabilization of broadband semiconductor light sources, Optics Letters, 1 vol. 10, No. 12 / Dec. 1985, p. 612-4.

*Primary Examiner* — Ryan A Lepisto
(74) *Attorney, Agent, or Firm* — Nemphos Braue LLC; Michael Antone

(57) ABSTRACT

A light source module (100) with integrated wavemeter components (460, 494, 495) for stabilizing the output power and wavelength of a superluminescent diode or other broadband semiconductor light source (121) outputting a broadband output beam. A portion of the source output beam is directed to an optical edge filter (460) with a cross-over wavelength lying within the bandwidth of the output beam. The edge filter (460) divides the light it receives into a short-wavelength component and a long-wavelength component. These two components are then directed onto respective photodetectors (494, 495) that output respective signals to a wavemeter controller. The controller adjusts the drive current and/or temperature of the source to maintain the mean wavelength of the source's output beam at a set constant value according to a control parameter determined from a combination of the photodetector signals such as their ratio or the ratio between their difference and sum.

20 Claims, 18 Drawing Sheets

(51) Int. Cl.
  *G02B 6/27* (2006.01)
  *G02B 6/293* (2006.01)
  *G02B 6/42* (2006.01)
  *G02B 27/10* (2006.01)
  *H10H 20/00* (2025.01)
  *H01S 5/0687* (2006.01)
  *H01S 5/50* (2006.01)

(52) U.S. Cl.
  CPC ........... *G02B 6/29398* (2013.01); *G02B 6/42* (2013.01); *G02B 27/1006* (2013.01); *H10H 20/042* (2025.01); *H01S 5/0687* (2013.01); *H01S 5/50* (2013.01)

(58) Field of Classification Search
  CPC ..... G02B 6/42; G02B 27/1006; H01S 5/0687; H01S 5/50; H10H 20/042
  See application file for complete search history.

(56) References Cited

U.S. PATENT DOCUMENTS

| | | | |
|---|---|---|---|
| 6,169,832 B1 | 1/2001 | McLandrich | |
| 7,348,583 B2 | 3/2008 | Velez | |
| 7,697,847 B2* | 4/2010 | Matsui | H04B 10/25133 |
| | | | 398/201 |
| 8,625,650 B2* | 1/2014 | Lewandowski | G01B 9/02004 |
| | | | 372/98 |
| 2006/0171633 A1 | 8/2006 | Voigt | |
| 2006/0219877 A1 | 10/2006 | Kaluzhny | |
| 2009/0072128 A1 | 3/2009 | MacDougall | |
| 2012/0199722 A1 | 8/2012 | Voigt | |
| 2020/0192017 A1* | 6/2020 | Dülk | G01B 9/02091 |
| 2021/0126427 A1 | 4/2021 | Nebendahl | |

FOREIGN PATENT DOCUMENTS

| | | |
|---|---|---|
| WO | 9966612 | 12/1999 |
| WO | 2002052755 | 7/2002 |
| WO | 2018175524 | 9/2018 |

\* cited by examiner

PRIOR ART

PRIOR ART

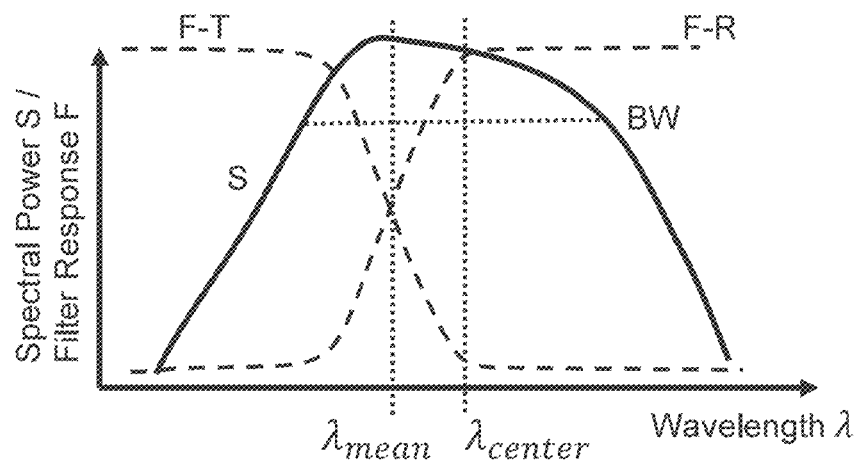
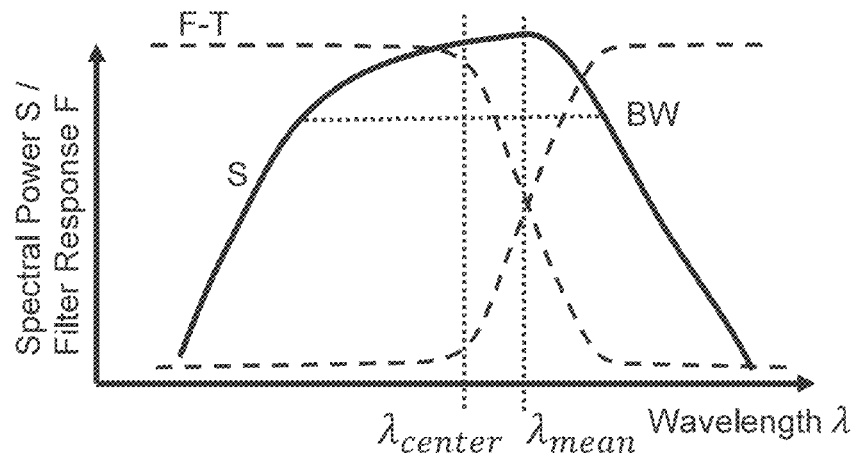

WAVELENGTH-STABILIZED BROADBAND LIGHT SOURCE

STATEMENT REGARDING FEDERALLY SPONSORED RESEARCH OR DEVELOPMENT

Not Applicable

CROSS-REFERENCE TO RELATED APPLICATIONS

This application claims priority to and the benefit of United Kingdom Patent Application No. GB2214448.9 filed on 30 Sep. 2022, the disclosure of which is incorporated by reference in its entireties.

BACKGROUND OF THE INVENTION

Field of the Invention

The invention relates a broadband light source with an optical wavemeter for active wavelength stabilization of the output beam.

Background

Broadband light sources, and modules therefor, are important components for a variety of systems, such as Fiber Optic Gyroscopes (FOGs), Fiber Optic Current Sensors (FOCS) and other similar interferometric fiber sensing systems. Broadband light source modules are also used in non-interferometric fiber sensing systems, for example Fiber Bragg Grating (FBG) interrogation systems which are used to perform remote sensing of temperature or strain or other parameters. Broadband light source modules are also used in the medical field, for example for optical coherence tomography (OCT).

Known light sources for broadband light source modules include superluminescent diodes (SLDs) and semiconductor optical amplifiers (SOAs) as well as combined SLD-SOA emitters. It is also known to provide modules that combine multiple SLDs, for example at different emission wavelengths with non-overlapping optical spectra, or at similar wavelengths with overlapping spectra in order to add more functionality or to provide a wider optical output spectrum for enhanced imaging performance. A broadband light source is incoherent in time, or may have reduced coherence time, but may be coherent or incoherent in space (e.g. a spatially coherent single-mode emitter).

For many applications, the mean wavelength of the optical output spectrum emitted from a broadband semiconductor light source is the relevant parameter. This mean wavelength $\lambda_{mean}$, commonly specified as the power-weighted mean wavelength, is defined by the integral of power spectral density $p(\lambda)$ of the output spectrum multiplied by the spectral position lambda $\lambda$ integrated over the entire range of the optical output spectrum, all divided by the total integrated power $P_{total}$, namely:

$$\lambda_{mean} = \frac{1}{P_{total}} \int p(\lambda) \cdot \lambda d\lambda$$

The mean wavelength $\lambda_{mean}$ of a broadband spectrum might be different from its center wavelength $\lambda_{center}$, the latter being defined as the average of minimum and maximum wavelength, namely:

$$\lambda_{center} = \frac{\lambda_{min} + \lambda_{max}}{2}$$

The minimum and maximum wavelengths are defined at a certain power spectral density level relative to the peak power spectral density $p_{peak}$, which is the maximum value of the power spectral density of the broadband spectrum, for example at −3 dB or −10 dB:

$$p(\lambda_{min,3dB}) = p(\lambda_{max,3dB}) = p_{peak} - 3 \text{ dB}$$

$$p(\lambda_{min,10dB}) = p(\lambda_{max,10dB}) = p_{peak} - 10 \text{ dB}$$

That means, the −3 dB minimum wavelength $\lambda_{min,3dB}$ and the −10 dB minimum wavelength $\lambda_{min,10dB}$ are the spectral positions on the short-wavelength side of the spectrum at which the power spectral density reaches −3 dB (around 50%) or −10 dB (10%) of $p_{peak}$, respectively. Similarly, the −3 dB maximum wavelength $\lambda_{max3dB}$ and the −10 dB maximum wavelength $\lambda_{max,10dB}$ are the spectral positions on the long-wavelength side of the spectrum at which the power spectral density reaches −3 dB (around 50%) or −10 dB (10%) of $p_{peak}$, respectively. Consequently, there are, at least, two values of the center wavelength that are commonly used to describe the spectral properties of broadband light sources, namely:

$$\lambda_{center,3dB} = \frac{\lambda_{min,3dB} + \lambda_{max,3dB}}{2}$$

$$\lambda_{center,10dB} = \frac{\lambda_{min,10dB} + \lambda_{max,10dB}}{2}$$

The definition of the optical bandwidth BW of a broadband light source follows the same logic and is expressed as the difference between maximum and minimum wavelength at a certain relative power level, namely:

$$BW_{3dB} = \lambda_{max,3dB} - \lambda_{min,3dB}$$

$$BW_{10dB} = \lambda_{max,10dB} - \lambda_{min,10dB}$$

Other relative power values could be used as well for the definition of bandwidth or minimum, maximum, center wavelength, for example −6 dB (around 25%), −13 dB (around 5%) or −20 dB (1%). If no relative power value is explicitly mentioned, then typically the spectral parameters at −3 dB (around 50%) are meant.

The wavelength stability (or drift) of the optical output spectrum emitted from a broadband semiconductor light source is commonly specified as the stability of drift of the mean wavelength. For example, for a FBG interrogation system, a change in the optical output spectrum of the source may translate into a different read-out signal from the remote sensors even though the sensing parameter like temperature, strain, pressure, etc. may not have changed in value. Similarly, for a FOG system, a change in the mean wavelength of the optical output spectrum of the source may affect the so-called scale factor or other performance parameters of the gyroscope. The scale factor translates the angular rotation speed of the FOG into a certain phase change of the two counter-propagating light waves in the interferometric fiber coil and is linearly related to the mean wavelength of the broadband optical output spectrum.

For broadband semiconductor light sources, such as SLDs and SOAs, the output power as well as the optical output spectrum are primarily defined by the electrical injection current, i.e. drive current, and by the temperature of the light-generating active region, which is located at the pn-junction of the device. For the output power, higher injection currents typically lead to higher output powers, while higher temperatures lead to lower output power values. For the broadband optical emission spectrum, higher temperatures lead to a red-shifting of the broadband spectrum to longer wavelengths, while lower temperatures lead to a blue-shifting to shorter wavelengths.

When changing the injection current applied to a broadband semiconductor light source, the mean wavelength of the optical output spectrum may either shift to shorter wavelengths, for example due to band-filling effects, or may shift to longer wavelengths, for example due to temperature-related or other effects, or may also remain somewhat unchanged around a local minimum. The exact behavior will depend not only on the operating point of the device but may also depend on specific design aspects of the epitaxial structure or of the chip design or it may also depend on manufacturing aspects of the semiconductor chip or of manufacturing aspects of the light source module.

For high-precision FOG systems, for example those used in an Inertial Navigation System (INS), the broadband light source needs to maintain a wavelength stability of better than ±200 ppm, in many cases a wavelength stability of better than ±100 ppm, and in some cases even a wavelength stability of better than ±50 ppm over several ten thousand hours of operation. For a broadband light source with a mean emission wavelength at 830 nm or 1550 nm, a relative change of ±50 ppm corresponds to a change in the mean wavelength of only 42 pm or 78 pm, respectively.

Such small wavelength changes in broadband semiconductor light sources, such as SLDs or SOAs, can also be induced by unintentional drifts of the current-generating electronics or of the active region's temperature, especially when considering the large temperature range of operation that may cover a range of −50° C. to +90° C. For example, even a temperature-stabilized semiconductor light source, like an SLD, that is packaged in an optical module with a temperature sensor and a thermo-electric cooler (TEC), may show wavelength changes on the order of up to ±200 ppm when the ambient temperature changes over a larger range of, for example, 150° C. This is typically because there is a temperature gradient inside the optical module between the temperature sensor and the light-generating active region of the semiconductor device, and this gradient is dependent on the heat sink temperature and thus on the ambient temperature.

Mean wavelength changes in the broadband emission spectrum may also be induced by optical back-reflections, especially when the amount or the polarization orientation of the back-reflected light is changing over time or temperature. Optical back-reflections into the light source module are commonly present as many applications are using a reflective fiber sensor, like a Sagnac interferometer in a FOG. Finally, wavelength changes of the emitted broadband spectrum may also originate from a slow degradation of the semiconductor device over time (i.e. aging over the lifetime of the device), for example due to a gradual reduction of the carrier injection efficiency into the active region, due to a slow but progressive growth of crystal defects, or due to a gradual degradation of the output facet of an edge-emitting semiconductor device.

Therefore, for various applications and for various reasons, there is a need for a broadband light source whose optical output spectrum can be monitored and adjusted such that a specific performance parameter, such as the mean wavelength, can be actively stabilized over a wide range of operating temperatures and over a long range of operating hours.

FIG. 1 shows schematically a prior-art configuration that follows the design approaches disclosed in each of:
MacDougall et al. (US2009/072128A1)
Voigt (US2006/171633A1)
Michel et al. (U.S. Pat. No. 6,108,086)
Wang (WO2018/175524A1)

The light source module 100 emits broadband light through an optical output O towards an optical coupler 200 that splits the received light into a first output signal OC, that is connected to the external system, for example the FOG or FOCS or FBG interrogation system, and into a second output signal T that is connected to an external wavelength sensor unit 300 that is capable of measuring the mean wavelength of the emitted spectrum of the light source module 100. The wavelength sensor unit 300 typically has an electrical output signal F that provides feedback to the light source module 100, thereby providing a feedback parameter value that is used for adjusting an operating condition of the light source module (typically drive current) such that the optical output spectrum is stabilized over time and temperature.

FIG. 2 shows an example construction of a wavelength sensor unit 300 according to the above-mentioned prior art where the optical input signal T split off from the external coupler 200, as shown in FIG. 1, propagates to another coupler 310 that splits the optical input signal into two output signals, which are forwarded to respective bandpass filters 320 and 330 that have different center wavelengths around which they transmit or reflect a narrow band of the optical output spectrum to respective photodetectors 340 and 350. The two photodetectors 340 and 350 generate respective electrical photodetector signals S1 and S2, which are connected to a processing unit 360 that performs a mathematical operation based on these electrical input signals S1 and S2 and that generates an electrical output signal F as a feedback parameter for the light source module 100 in order to stabilize its emission wavelength.

An external wavelength sensor unit, referred to as a wavemeter, is thus realized with two narrowband bandpass filters at two different center wavelengths that both lie within the spectral width of the broadband light source, for example one bandpass filter having its center wavelength at the lower edge of the optical output spectrum and the other bandpass filter having its center wavelength at the upper edge of the optical output spectrum. In examples of prior art (e.g., above-referenced Michal et al, Voigt 2006, MacDougall et al), those bandpass filters are realized with FBGs that reflect a narrowband portion of the optical output spectrum. A variation of this design is to use more than two bandpass filters and associated photodetectors (e.g., Michal et al). Another variation is to only use one narrowband bandpass filter.

One of the drawbacks of this prior-art design is that it relies on an external wavelength sensor unit 300 that forms its own optical module separate from the light source module, thereby requiring additional space for integration into the sensor system. There are also costs associated with the sensor unit and its assembly into the system. Most importantly, though, is that the external wavelength sensor unit may require additional temperature stabilization, especially when FBG-based filters are used as the center wavelength of those FBG filters is highly dependent on the ambient temperature. It would therefore be better to integrate the wavelength sensing unit (wavemeter) together with the light source into a common module not only to reduce cost and footprint but also to realize improved wavelength stability.

FIGS. 3 and 4 show two different prior art SLD light source modules with an integrated wavemeter as both disclosed in:

Kaluzhny et al (US2006/219877A1)

FIG. 3 shows a first design. The SLD chip 121 outputs a primary beam O from its front facet. The SLD chip 121 also outputs a secondary beam from its rear facet, which is used for optical power and wavelength monitoring. The secondary beam is split by a non-polarizing beamsplitter 180 that divides the light emitted from the SLD's back facet into a first beam component and a second beam component. The first beam component propagates directly to a first photodetector 192, which monitors the output power of the SLD based on the assumption that the power in the secondary beam scales with the power in the primary beam. The second beam component propagates to a second photodetector 191 via transmission through a narrowband bandpass filter 160, which monitors the output power of the SLD at the wavelength transmitted by the bandpass filter.

FIG. 4 shows a second design similar to the first but in which two bandpass filters 160, 170 are used instead of one. Namely, the first and second beam components split off by the non-polarizing beamsplitter 180 are passed through respective bandpass filters 160, 170 before arriving at their respective first and second photodetectors 191, 192.

FIGS. 5 & 6 are schematic graphs for the light source modules of FIGS. 3 and 4 respectively that are shown to explain the relationship between the optical output spectrum of the broadband light source and the filter response(s) of the narrowband bandpass filter(s) used in each case.

FIG. 5 shows the spectral positioning of the single narrowband bandpass filter 160 of the design of FIG. 3 with its filter response F0 relative to the broadband spectrum S of the SLD light source. In such a configuration, the filter response F0 of the narrowband bandpass filter 160 is arranged somewhere in the optical output spectrum S—a central position being illustrated. Using a single narrowband bandpass filter in this way makes it difficult to distinguish between wavelength changes towards longer and shorter wavelengths, since both cause a reduction in the power transmitted through the bandpass filter.

FIG. 6 shows the spectral positioning of the two narrowband bandpass filter 160, 170 of the design of FIG. 4 with its filter responses F1 and F2 relative to the broadband spectrum S of the SLD light source. Response curve F1 is positioned on the lower flank of the broadband spectrum S and response curve F2 is positioned on the upper flank. Use of two narrow bandpass filters in this way provides for a differentiation of wavelength changes towards shorter or longer wavelengths, since a wavelength shift of the light source towards shorter wavelengths, for example, would result in an increase of the response F1 of the first filter and, simultaneously, in a decrease of the response F2 of the second filter.

A drawback of both these prior art designs from Kaluzhny et al. arises from the fact that they rely on monitoring of the emission from the back of the SLD light source. While it is true that certain SLD light sources emit broadband light from both their front and back chip facets, the optical power levels and optical spectra emitted from the front and back facets of an SLD chip are not exactly identical. This is because any kind of intentional or unintentional asymmetry in the SLD chip design or between the front and back facets, for example small differences in the anti-reflection coatings that are applied to each facet, may result in different optical properties of the light emitted at the front and back facet. For example, the effective facet reflectivity at the back side might be higher compared to the effective facet reflectivity at the front side, which results in more light traveling from back to front than vice versa. This will result in more output power at the front facet compared to the back facet of the SLD device. Moreover, the generation of broadband light in an SLD is governed by amplified spontaneous emission (ASE) that is generated by light propagating along an optical waveguide and experiencing an exponential amplification with a spectrally dependent modal gain, the latter being dependent on the carrier density in the active region. Therefore, an asymmetric output power between front and back facet of an SLD or an SOA also means that the forward-propagating light inside the semiconductor waveguide device depletes the carrier density differently and thus experiences a different modal gain, both in magnitude as well as spectral position and spectral shape, compared to the backward-propagating light, thereby resulting in slightly different optical spectra being output from the front and back chip facets. Consequently, for applications requiring extremely high-precision wavelength stabilization from the output of an SLD (i.e. from its front facet), it is not ideal to base this in monitoring the output from the back facet.

FIG. 7 shows a prior-art light source module based on a broadband semiconductor SLD source that is integrated with an optical wavemeter as disclosed in:

Voigt (US2012/199722 A1)

The light source module 100 incorporates a broadband semiconductor light source 121, such as an SLD 121. The SLD 121 and other components are mounted on a substrate 110. The substrate has a temperature sensor 111 mounted thereon. The substrate 110 is thermally connected to a thermoelectric controller, TEC, such as a Peltier element (not shown), which is used for temperature regulation of the substrate 110 with a suitable temperature regulating unit (not shown). The beam output from the front output facet of the SLD 121 is focused through suitable optics 140 into a collimated beam, which is transmitted through a polarization filter 250 onto an optical beamsplitter 180. The beamsplitter 180 splits off a portion of the incoming light beam for the wavemeter components, namely a neutral density filter 255 and a double PIN photodiode detector 290 having two adjacent PIN junctions 291, 292 that are spatially separated from each other to form first and second active regions that each receive part of the incoming beam. The remainder of the beam passes through the beamsplitter 180 and is output as an output beam O from the module 100 using a polarization-maintaining optical fiber 102. More specifically, the beam passes from the beamsplitter 180 onto the optical fiber 102 via another polarizing element 250 and suitable focusing optics 140. The double PIN photodiode detector 290 is a custom device that is fabricated such that the first active region 291 and the second active region 292 have different spectral responsivity curves. The light source module 100 is additionally configured as a transceiver in that back-traveling light that comes into the module 100 externally via the optical fiber 102 is sensed by a further photodiode detector 193, which receives the back-traveling light via the beamsplitter 180 and a further polarizing element 250. A transceiver function is needed in the case that the optical fiber 102 leads to an external fiber sensor, as would for example be the case for a FOG or a FOCS.

We understand the operating principle of the double PIN photodiode detector 290 to be as follows. This is our interpretation of the disclosure of Voigt. FIG. 8a shows our understanding that the first photodetecting element with the first active region 291 would have a spectral responsivity curve PD1, which detects a lower portion of the broadband optical output spectrum S. Moreover, it shows our understanding that the second photodetecting element with the second active region 292 would have a spectral responsivity curve PD2, which detects an upper portion of the broadband optical output spectrum S. Consequently, the two photodetecting elements 291, 292 of the double PIN photodiode detector 290 have spectral response curves Res-PD1 and Res-PD2 respectively, as shown in FIG. 8b, which allow wavelength changes of the broadband semiconductor light source towards shorter wavelengths to be distinguished from wavelength changes towards longer wavelengths.

One benefit of the optical architecture of FIG. 7, compared to that of FIGS. 3 & 5, is that the integrated optical wavemeter is realized by tapping off light from the main output beam of the SLD, i.e. the beam emitted from its front facet, not a secondary output from the back facet. However, using a custom double PIN photodiode detector is a drawback, since it must be tailored to the broadband semiconductor light source. Any major change in the emission wavelength or in the spectral bandwidth of the broadband semiconductor light source is likely to require a redesign of the double PIN photodiode detector, which means that a new epitaxial design for the two active regions may have to be realized, thereby consuming engineering efforts, time and associated costs. Furthermore, the effective spectral response curves Res-PD1 and Res-PD2 of the two active regions, as shown in FIGS. 8a and 8b, each have a spectral characteristic that is determined by the semiconductor band characteristics of the double PIN photodiode's compound semiconductor material, which will make it difficult to realize a steep filtering characteristic with good discrimination between the upper or lower parts of the broadband spectrum, S. The ability to realize a steep filter characteristic and high discrimination is important for achieving high wavelength resolution of the wavemeter.

BRIEF SUMMARY OF THE INVENTION

According to an aspect of the invention there is provided a light source module comprising:
- a broadband semiconductor light source configured to emit an output beam whose power is distributed over an output spectrum which defines a bandwidth;
- an optical edge filter with a cross-over wavelength lying within the bandwidth of the broadband semiconductor light source, the optical edge filter being arranged to receive a portion of the output beam and divide it by transmission and reflection into short-wavelength and long-wavelength components;
- first and second photodetectors each arranged to receive one of the wavelength components reflected and transmitted by the optical edge filter and configured to output respective first and second photodetector signals indicative of the power of the wavelength component received; and
- an output element through which the output beam exits the light source module.

The optical edge filter and the first and second photodetectors collectively provide the light source module with an integrated wavemeter. The edge filter can be either a long-wave pass (LWP) filter or a short-wave pass (SWP) filter as desired. A LWP filter is configured to reflect the short-wavelength component and transmit the long-wavelength component. A SWP filter is configured to reflect the long-wavelength component and to transmit the short-wavelength component.

In some embodiments, the output element is an optical fiber or multiple optical fibers. The optical fiber(s) has an end into which the output beam is coupled. Alternatively, a free-space beam may be output through a window.

To provide a transceiver function, the module may further comprise an additional photodetector arranged to receive light that has traveled backwards into the light source module, e.g. through an optical fiber.

There are different options for tapping off a portion of the output beam into the wavemeter. One option is to obtain said portion of the output beam received by the optical edge filter by collecting light scattered from the end of the optical fiber used for coupling the output beam out of the light source module. Another option is to provide a beamsplitter which is arranged to tap off a portion of the output beam for the optical edge filter.

It may be advantageous in certain embodiments to provide a broadband bandpass filter having a bandpass spectrum that fits within the output spectrum of the broadband semiconductor light source. The broadband bandpass filter will thereby clip and reshape the output spectrum from the broadband semiconductor light source. The broadband bandpass filter is arranged in the path of the output beam.

Embodiments of the invention can be based around a variety of broadband semiconductor light source types with superluminescent diodes, SLDs, and semiconductor optical amplifiers, SOAs, being of particular interest. The broadband semiconductor light source may incorporate multiple SLDs or multiple SOAs or one or more combined SLD-SOA sources.

Maximum wavelength sensitivity of the wavemeter will be achievable when the cross-over wavelength of the optical edge filter coincides with a mean wavelength of the output spectrum of the broadband semiconductor light source, more specifically a mean wavelength that is attainable in normal operation of the broadband semiconductor light source. In other words, the broadband semiconductor light source will have an output spectrum and hence a mean wavelength that is tunable over a certain range via the drive current and the active region temperature and it is desirable that the cross-over wavelength of the optical edge filter is within that tuning range, preferably somewhere near the middle of the tuning range. This enables an external controller to set the mean wavelength of the broadband semiconductor light source at the cross-over wavelength and then use this as the operating point for the feedback control.

The transition range of the optical edge filter is preferably matched to the bandwidth of the broadband optical source. In certain embodiments, the transition range of the optical edge filter is less than a fraction of the bandwidth of the broadband optical source light as received at the optical edge filter, wherein said fraction is one of: unity, a half, a third, a quarter, a fifth, a tenth (10%), 5%, 4%, 3%, 2% or 1%. The bandwidth can be as measured at the −3 dB points or −10 dB points of the output spectrum, for example. The transmission range can be defined as the wavelength range over which the transmissivity of the edge filter changes from 2% to 98% and the reflectivity changes from 98% to 2%, for example.

In certain embodiments, the light source module further comprises a photonic integrated circuit chip comprising waveguiding paths arranged to convey the output beam emitted from the broadband semiconductor light source between components of the module including one or more of the broadband semiconductor light source, the optical edge filter, the first photodetector, the second photodetector and the output element.

In certain embodiments, the light source module further comprises:
- a substrate on which components of the light source module are mounted, including at least the broadband semiconductor light source;
- a temperature sensor arranged in thermal contact with the substrate to provide a substrate temperature signal indicative of the substrate temperature;
- a heating/cooling element arranged in thermal contact with the substrate in order to heat/cool the substrate.

In certain embodiments, the light source module further comprises:
- a temperature sensor arranged adjacent the broadband semiconductor light source to provide a source temperature signal that tracks temperature changes of the broadband semiconductor light source in operation.

It will be appreciated that the above-specified light source module with integrated wavemeter will be used in combination with a suitable external controller for controlling how the broadband semiconductor light source is driven to maintain a stable output power and mean wavelength in response to the photodetector signals collected by the integrated wavemeter components as well as optionally temperature sensor readings from one or more temperature sensors integrated in the light source module.

Specifically, the light source module may further comprise a controller that is configured to operate the broadband semiconductor light source at operating points of source drive current and source temperature which together maintain the mean wavelength at a constant value according to a control parameter determined from at least one of the first and second photodetector signals output by the first and second photodetectors.

The control parameter in certain embodiments may be or include: a ratio of the first and second photodetector signals; a ratio between the difference and the sum of the first and second photodetector signals; or another mathematical function using both the first and second photodetector signals as variable operands.

For example, the controller can be configured to adjust the drive current operating point through adjustment of drive current supplied to the broadband semiconductor light source, and wherein the controller is configured to adjust the source temperature operating point by maintaining the source temperature signal at a constant value. The controller may also be configured to maintain the substrate at a constant temperature as indicated by the substrate temperature signal. The controller may also be configured to operate the broadband semiconductor light source to maintain a constant output power, e.g. output power integrated across the output spectrum as represented, for example, by the sum of the two photodetector signals.

A significant benefit achievable with certain embodiments of the invention is that the optical edge filter design provides an integrated wavemeter possessing similar differentiation of power and wavelength changes to what is achievable in the above-mentioned prior art design with two narrowband bandpass filters but with a simplified layout. Moreover, compared to the narrow bandpass filter design, the integrated wavemeter can be realized at lower cost because a smaller number of optical components need to be manufactured and assembled inside the module. Another benefit is that the fabrication of optical edge filters is much simpler than the fabrication of narrowband bandpass filters, which require a larger number of coating layers with a tighter control of thickness and refractive indices of its layers.

A significant benefit achievable with certain embodiments of the invention is that the optical wavemeter is integrated into the light source module with the broadband semiconductor light source, which enables the wavemeter components, including the optical edge filter, to be stabilized in temperature on the same optical bench as the light source. This can provide superior wavelength reading accuracy and thus superior wavelength stability compared to prior art with an external wavemeter.

A significant benefit achievable with certain embodiments of the invention is the ease with which the wavemeter can be customized to any specified mean wavelength of broadband light source. An optical edge filter can be easily tailored not only so that the edge itself lies close to any particular wavelength, i.e. here the mean wavelength of the broadband light source, but also so that the edge has a transition between transmission and reflection that is optimized to the spectral shape of the broadband optical output spectrum of the broadband light source. For example, the spectral slope of this transition between transmission and reflection band can be maximized near the mean wavelength of the broadband light source, which will result in an increased wavelength sensitivity. Furthermore, during assembly of the module, when putting the optical edge filter into place in the free-space beam path (i.e. before cementing the filter into place), the exact spectral position for the transition from transmission to reflection (i.e., the so-called cross-over wavelength of the edge filter) can be fine-tuned and optimized by changing the placement of the filter, e.g. by small increments or decrements in rotation angle or tilt angle will shift this cross-over wavelength towards longer or shorter wavelengths, respectively, thereby maximizing the wavelength sensitivity of the wavemeter.

A light source module according to embodiments of the invention can be used as a component in an an optical fiber sensor system. The optical fiber sensor system comprises an optical fiber or fibers which individually or collectively provide a desired sensing function. The sensing optical fiber(s) receive light from the output beam of the light source module. In certain embodiments, the light module integrates an optical fiber output element with the sensing optical fiber(s). In certain embodiments, the source light module may be a transceiver, i.e. comprises an additional photodetector arranged to receive light that has traveled backwards into the light source module through the optical fiber output element or a separate optical fiber. The optical fiber in such an optical fiber sensing system may provide a sensing function for a Fiber Optic Gyroscope (FOG) or for a Fiber Optic Current Sensor (FOCS). The optical fiber in such an optical fiber sensing system may incorporate a Fiber Bragg Grating (FBG), e.g. for strain or temperature sensing.

BRIEF DESCRIPTION OF THE DRAWINGS

This invention will now be further described, by way of example only, with reference to the accompanying drawings.

FIGS. 11a and 11b are schematic graphs of an optical output spectrum of the broadband light source and of the spectral filter characteristics of the optical edge filter, according to embodiments of the invention, where the optical edge filter is aligned with the mean wavelength of the broadband spectrum that does not coincide with the center wavelength of the broadband spectrum.

DETAILED DESCRIPTION OF THE INVENTION

In the following detailed description, for purposes of explanation and not limitation, specific details are set forth in order to provide a better understanding of the present disclosure. It will be apparent to one skilled in the art that the present disclosure may be practiced in other embodiments that depart from these specific details.

Figure 1:
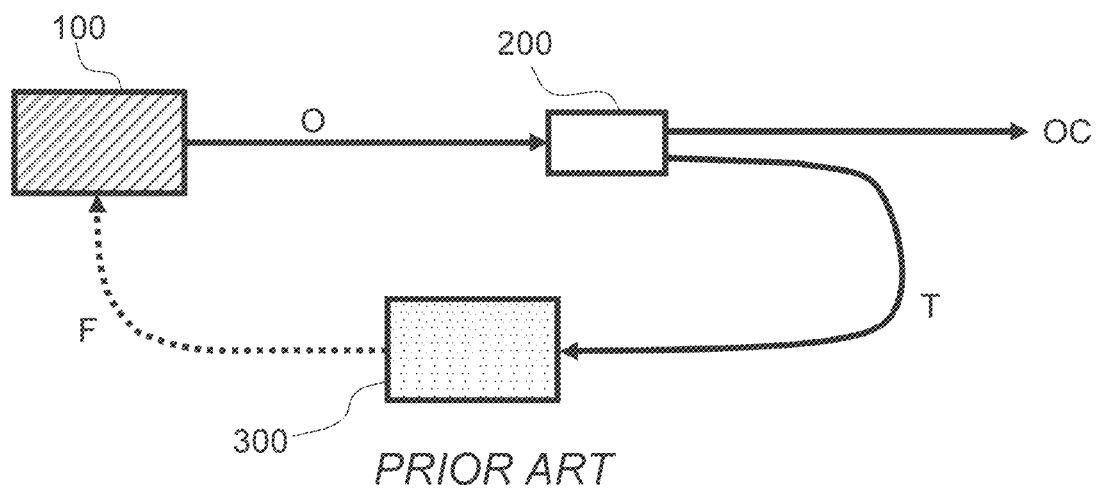
FIG. 1 is a schematic drawing of a prior art light source module with an external optical coupler and an external wavemeter.
Figure 2:
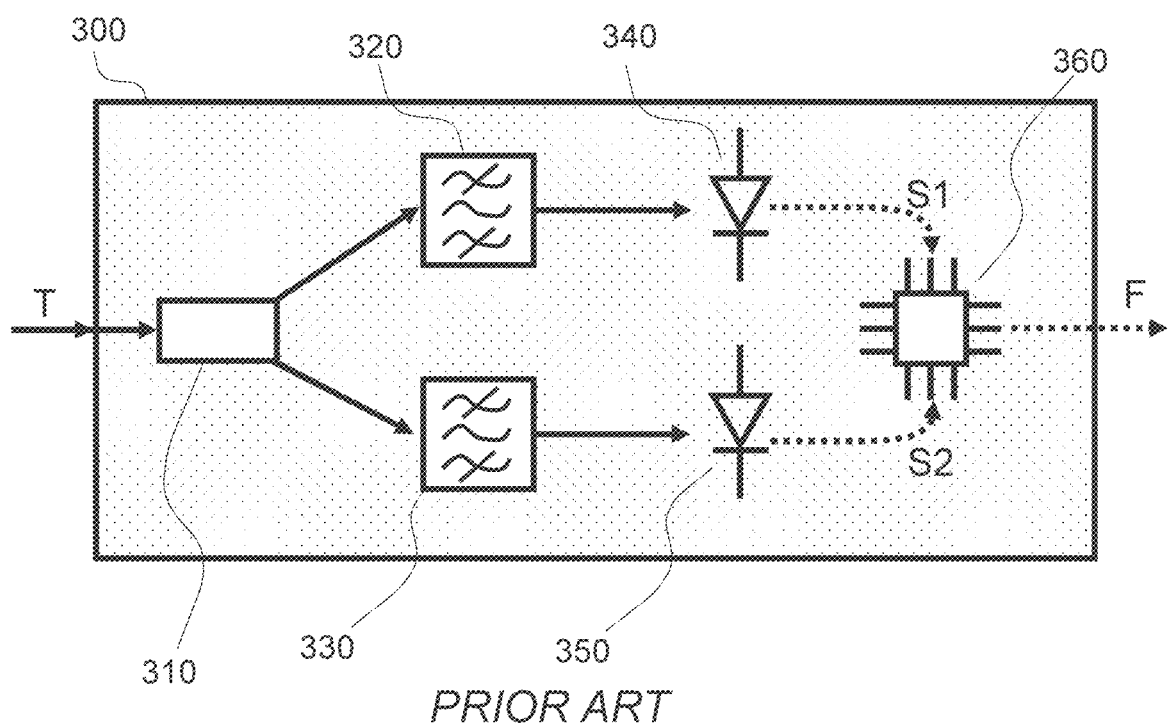
FIG. 2 is a schematic drawing of a prior art external wavemeter with an integrated optical coupler and two narrowband bandpass filters, two photodetectors and a processing unit.
Figure 3:
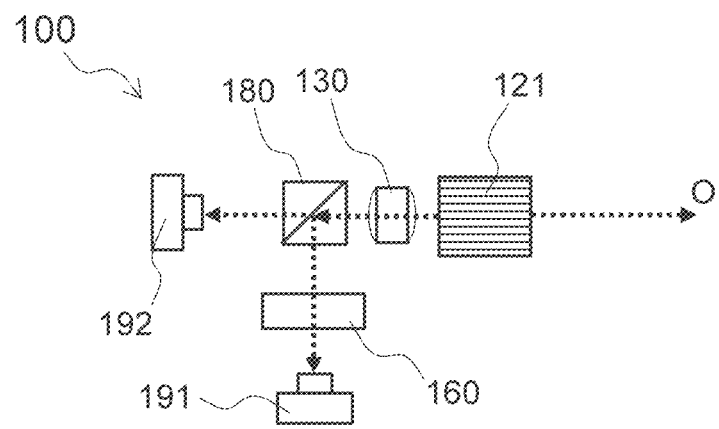
FIG. 3 is a schematic drawing of a prior art light source module with an integrated wavemeter, consisting of a single narrowband bandpass filter, and an integrated power monitor at the back side of a broadband light source.
Figure 4:
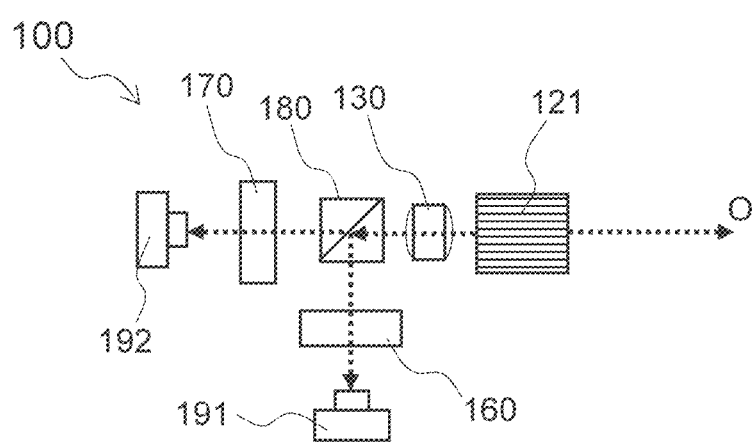
FIG. 4 is a schematic drawing of a prior art light source module with an integrated wavemeter, consisting of two narrowband bandpass filters, at the back side of a broadband light source.
Figure 5:
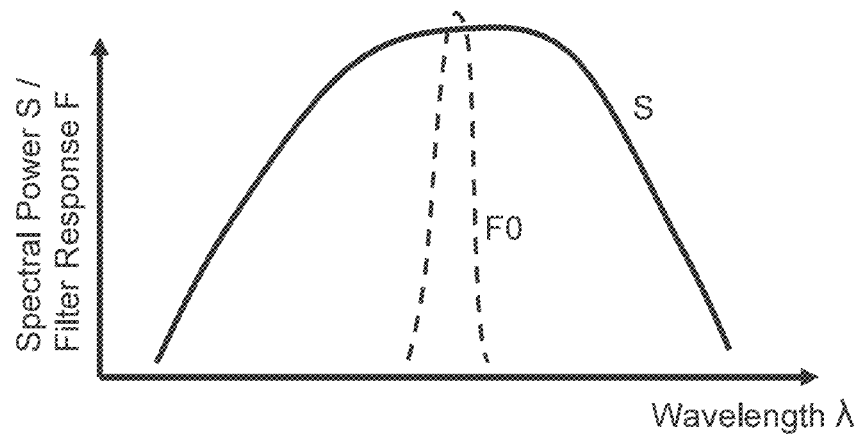
FIGS. 5 & 6 are schematic graphs for the prior art light source modules of FIGS. 3 and 4 respectively showing in each case the optical output spectrum of the broadband light source and also the filter response(s) of the narrowband bandpass filter(s).
Figure 6:
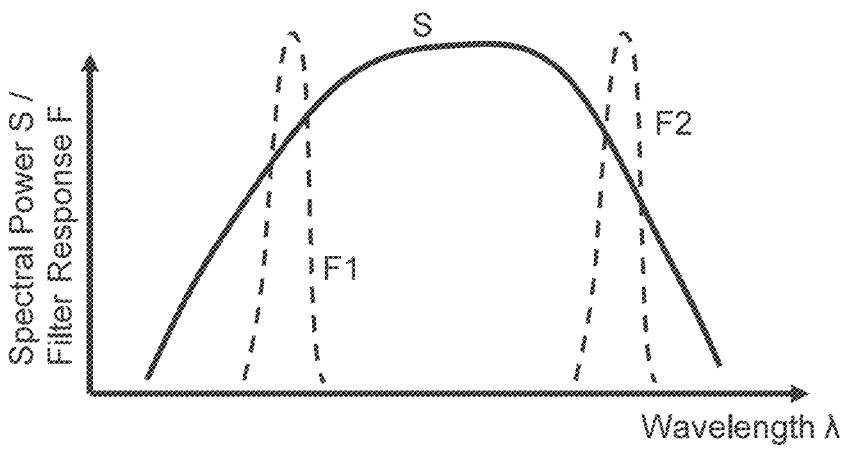
Figure 7:
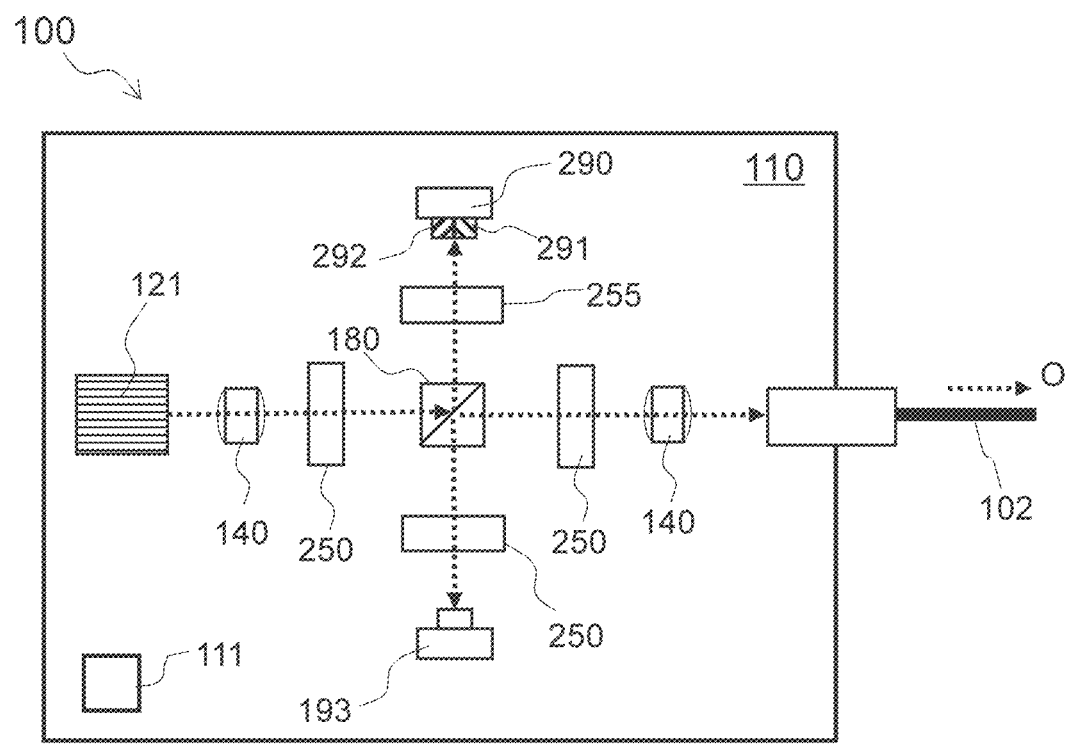
FIG. 7 is a schematic drawing of a prior art transceiver light source module with an integrated wavemeter, consisting of a dual-photodetecting element at the front side of a broadband light source, and an integrated receiver photodiode.
Figure 8A:
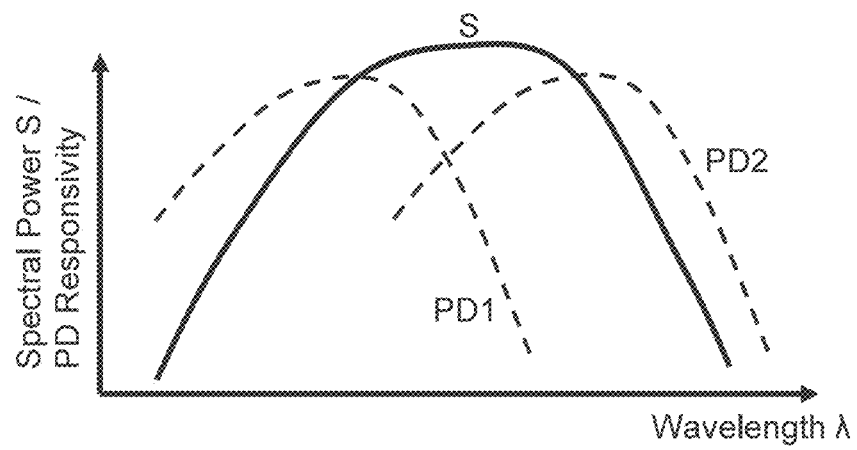
FIGS. 8a and 8b are schematic graphs of an optical output spectrum of the broadband light source and of the spectral responsivity curves of the dual-photodetecting element according to our understanding of the prior art of FIG. 7.
Figure 8B:
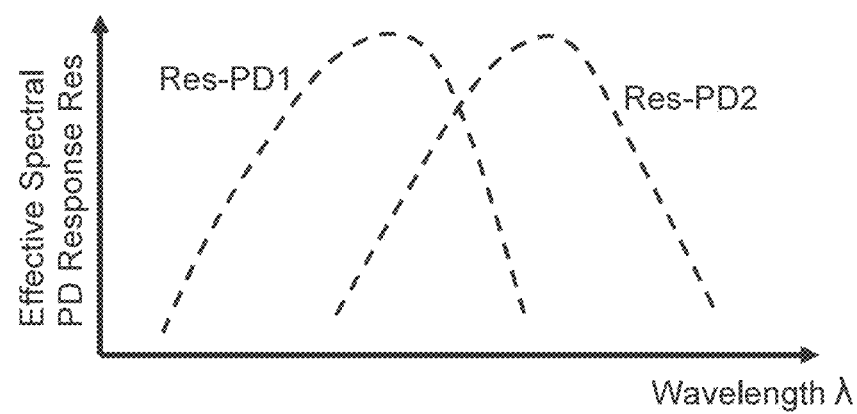
Figure 9:
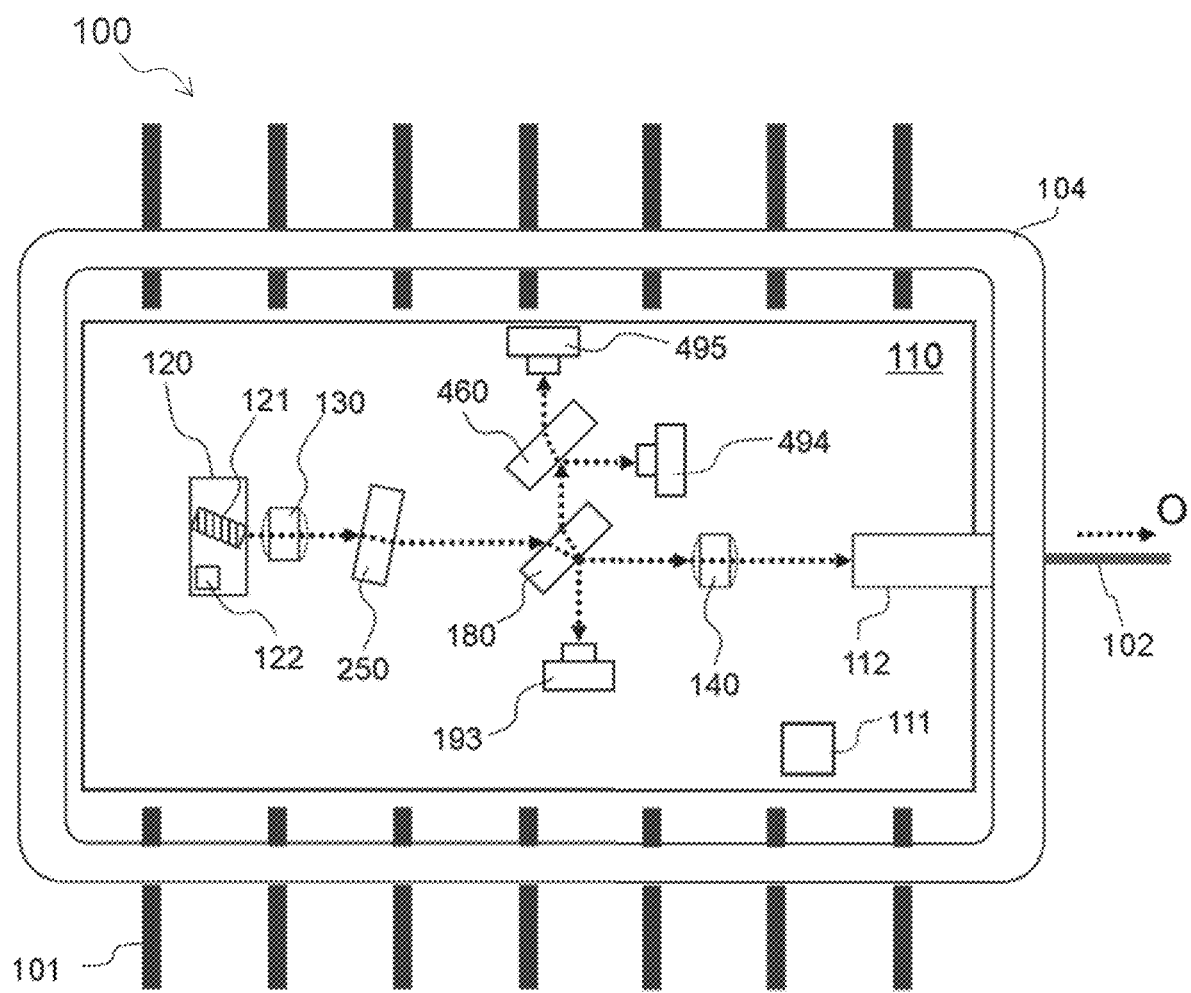
FIG. 9 is a schematic drawing of a transceiver light source module according to an embodiment of the invention with an integrated wavemeter, consisting of an optical edge filter and two photodetectors, at the front side of a broadband light source, and an integrated receiver photodiode.

FIG. 9 is a schematic drawing of a light source module 100 according to an embodiment of the invention based around a broadband semiconductor light source 121, more particularly but not exclusively a broadband semiconductor light source such as an SLD or SOA, which are typically (but not always) fabricated as edge-emitting devices. The light source module 100 is based on a butterfly (BTF) package, shown as a 14-pin BTF package. As an alternative to a standard BTF package, a custom package could be used to house the components, e.g. if space is at a premium. The butterfly package has a housing 104 and a plurality of terminal pins 101 via which external electrical connections can be made to components within the housing 104. The housing 104 forms an enclosure in which the broadband semiconductor light source and other components are accommodated. The components are, at least for the most part, mounted directly or indirectly on a optical bench 110, which may also be referred to as a main board, carrier board, substrate, optical breadboard or mounting board. The optical bench 110 serves as a substrate on which the various components can be mounted, such as the ferrule 112. The optical bench 110 can be realized with different materials, such as ceramics, metal, silicon, or semiconductor compounds or other materials that provide high mechanical robustness and stiffness in combination with good thermal conductivity. Suitable ceramics materials are AlN or Al2O3. Suitable metals are copper, aluminium or alloys containing either or both of these metals such as CuW. The upper and/or lower surface of the optical bench 110 may be metallised to support solder processes for the attachment of the components, in particular for electrical connections. Metallisation may also aid good thermal connection to cooling elements for maintaining the temperature inside the enclosure within a specified range. For physical attachment of components by bonding, e.g. with epoxy resin, the upper and/or lower surfaces of the optical bench 110, or selected areas thereof, may be specified with a minimum surface roughness to provide good adhesion.

The housing 104 and the enclosure it defines by its internal walls and lid are substantially rectangular in plan view as illustrated aligned with orthogonal axes across and along the module as illustrated. The light source module 100 has its optical output port arranged at one end of the enclosure in an end wall of the housing 104. The light source module 100 delivers its optical output beam O through the optical fiber 102. The optical fiber 102 may be single mode or multimode and may be polarisation-maintaining (PM) fiber as desired. One end of the optical fiber 102 lies inside the housing 104 and is held, for example, in an optical fiber ferrule 112. The ferrule 112 and optical fiber end portion form a so-called pigtail and serve to provide efficient coupling out of the output beam O from the broadband semiconductor light source 121 into the end of the optical fiber 102 and thence out of the light source module 100. The fiber ferrule 112 may be attached to the optical bench 110, or may be secured to the housing 104, e.g. to the end wall. It will be appreciated that the light source module 100 also has a lid (not shown) which may be secured removably or nonremovably to the housing 104 by fasteners, such as screws or rivets, and/or adhesive bonding, welding or other fastening or sealing means as desired.

The optical bench 110 is temperature-stabilized and for this purpose is provided with at least one temperature sensor 111 integrated on the optical bench 110. A thermo-electric cooler (TEC) is provided, such as a Peltier element, which is conveniently mounted underneath, i.e. on the underside of, the optical bench 110. The role of the TEC is to hold the optical bench 110 and thus the various mechanical, optical and electrical components mounted thereon at a set temperature. The optical bench and TEC also provides a heat sink for the "hot" broadband semiconductor light source 121 as well as any other "hot" components that the module may include. The temperature sensor 111 is used to realize, in combination with the TEC, a set temperature for the optical components mounted to the optical bench 110. The broadband semiconductor light source 121 is illustrated as being mounted on a separate submount 120. (Alternatively, the broadband semiconductor light source 121 could be mounted directly on the optical bench 110.) A further temperature sensor 122 is arranged adjacent the broadband semiconductor light source 121 to provide a temperature measurement that tracks the temperature of the light-generating active region, which is located at the pn-junction of the device. The source's temperature sensor 122 could be used to provide an additional signal to perform an optional calibration of the light source module 100, for example to measure the internal temperature gradient between the optical bench's temperature sensor 111 and the source's temperature sensor 122, or to measure and calibrate the emission wavelength of the light source module as a function of the reading from the source's temperature sensor 122. The source's temperature sensor 122 could be also used to stabilize the inside temperature of the light source module, i.e. the external controller may use the built-in TEC to stabilize the source's temperature sensor 122 and not the temperature sensor 111. The divergent, broadband light emitted from the broadband light source 121 is collimated with a collimation lens 130. In order to increase the PER of the light source module, a polarization filter 250 is included. (Alternatively, the polarization filter may be omitted.) The collimated beam received from the polarization filter 250 is divided by an optical beamsplitter 180 into a first beam that provides the module's output and a second beam that is the input beam for the wavemeter components. The first beam, for output, propagates to the output port of the module where the end of the optical fiber 102 is located in its ferrule 112. For efficient out-coupling, a focusing lens 140 is provided to focus the first beam onto the end of the optical fiber 102. The second beam propagates to an optical edge filter 460 which has a single edge near the mean wavelength of the broadband light source, for example such that the edge filter 460 has a high transmissivity, F-T, for wavelengths below the mean wavelength and a low transmissivity for wavelengths above the mean wavelength. Accordingly, such an edge filter would show a low reflectivity, F-R, for wavelengths below the mean wavelength and a high reflectivity for wavelengths above the mean wavelength. The beam transmitted through the optical edge filter propagates to and is received by a first photodetector 495, while the beam reflected at the optical edge filter 460 propagates to and is received by a second photodetector 494.

The optical characteristics relevant for the wavemeter components are now described in more detail.

Figure 10A:
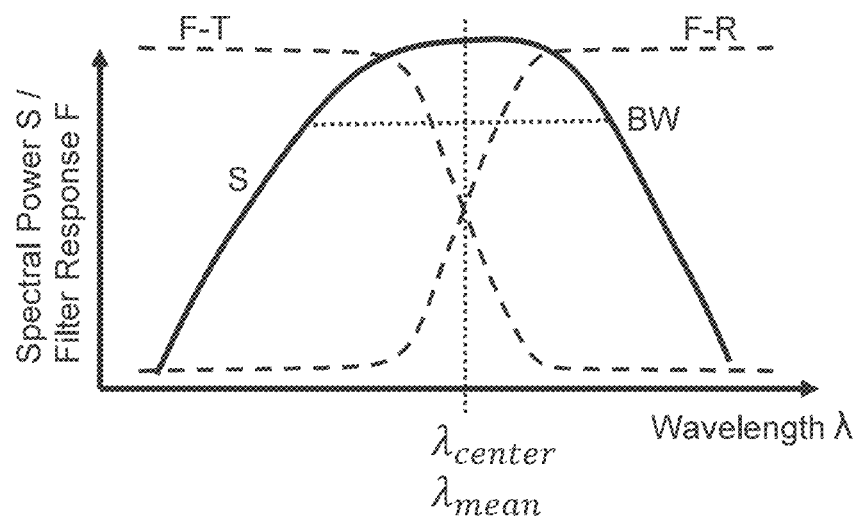
FIGS. 10a and 10b are schematic graphs of an optical output spectrum of the broadband light source and of the spectral filter characteristics of the optical edge filter and of the resulting filter response curves according to embodiments of the invention.
Figure 10B:
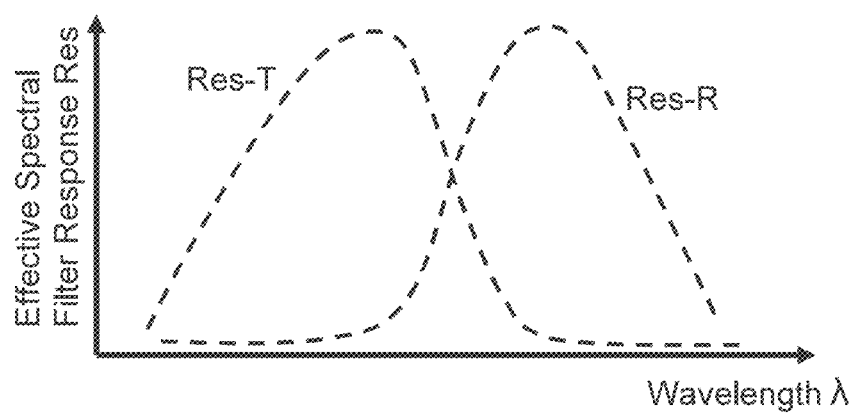

FIG. 10a is a schematic graph showing the optical output spectrum S of the broadband semiconductor light source and the spectral filter characteristics of the optical edge filter in transmission and reflection, F-T and F-R. FIG. 10b is a schematic graph showing the response curves in transmission and reflection, Res-T and Res-R, that follow from the combination of the output spectrum S and edge filter characteristics F-T and F-R of FIG. 10a. The first photodetector 495 receives a short-wavelength portion Res-T of the optical output spectrum S while the second photodetector 494 receives a long-wavelength portion Res-R of the optical output spectrum. The first and second photodetectors 494 and 495 thus output electrical photodetector signals PD1 and PD2 having magnitudes proportional to the intensity of the light that is incident upon them after respective transmission through and reflection from the optical edge filter 460.

It will be understood that the optical edge filter characteristic shown in FIG. 10a is of an edge filter that transmits the short-wavelength components, which in the art is referred to as a short-wave pass (SWP) filter. Generally, an optical edge filter is referred to either as a SWP filter or a long-wave pass (LWP) filter depending on whether the transmitted wavelength components are the longer or shorter wavelength ones, respectively. Both types are suitable for implementing embodiments of the invention. Therefore, the optical edge filter in the embodiment of FIG. 9, and all subsequent embodiments of the invention described further below, could be either a LWP or a SWP filter. With a SWP filter 460, the first photodetector 495 would receive a short-wavelength portion Res-T of the input spectrum transmitted through the optical edge filter, whereas the second photodetector 494 would receive a long-wavelength portion Res-R of the input spectrum reflected by the SWP edge filter, as shown in FIG. 10b.

A relevant characterizing parameter of an edge filter is the wavelength (or frequency) value or wavelength position of its edge, which can be defined as the wavelength where there amounts of optical power transmitted and reflected by the edge filter are equal—referred to as the cross-over wavelength; this being the crossing point between the reflection band and the transmission band of the edge filter.

Another relevant characterizing parameter of an edge filter is the so-called transition range of the filter, which is a measure of the sharpness of the edge, which can be expressed by the spectral range or spectral width over which the filter changes from transmissive to non-transmissive, for example, the range over which the transmissivity changes from 2% to 98% and the reflectivity changes from 98% to 2%. Depending on whether the edge filter is of type LWP or SWP, the transition range may also describe the opposite behavior, i.e. a change of transmissivity from 98% to 2% in combination with a reflectivity change from 2% to 98%, for example. Therefore, an edge filter with small transition range will have a steeper, more abrupt spectral slope of its edge, while an edge filter with a large transition range will have a shallower, more gradual spectral slope of its edge.

For maximum sensitivity to wavelength drifting of the source, the cross-over wavelength of the optical edge filter is set to coincide with a mean wavelength of the output spectrum, S, of the broadband semiconductor light source that is attainable in normal operation of the broadband semiconductor light source. For the sake of linguistic simplicity in the following we refer to the mean wavelength based on the understanding that the mean wavelength of the broadband semiconductor light source will be a value that depends on the operating point, which is principally defined by the temperature of the active region and the drive current. In operation, the broadband semiconductor light source will have its operating point controlled such that the wavemeter control signal and, therefore, the instantaneous mean wavelength of the light source is constant over time and temperature, which may include an initial adjustment of the mean wavelength to make it coincide with the cross-over wavelength of the optical edge filter for maximum sensitivity of the wavemeter.

According to embodiments of this invention, the optical edge filter deployed in the wavemeter will split the spectrum of the broadband light source into a short-wavelength and into a long-wavelength portion, each being detected by a corresponding photodetector. When the cross-over wavelength of the edge filter coincides with the mean wavelength of the broadband source, then the short-wavelength portion and the long-wavelength portion have the same amount of integrated optical power. The output signals of the two corresponding photodetectors will then have the same signal amplitude, which means that the two signals PD1 and PD2 are balanced. In this case, the difference PD1-PD2 will be zero. Therefore, it is possible to realize embodiments of the invention in which the integrated wavemeter has superior sensitivity compared to certain prior art, e.g. when narrow bandpass filtering is performed, because the two signals PD1 and PD2 are both large signals and both of similar magnitude. In the ideal configuration, with the cross-over wavelength of the edge filter coinciding with the mean wavelength of the broadband light source, exactly half of the total power split off from the broadband light source for the wavemeter will be in each component collected by the two photodetectors. This situation is superior to the prior art designs that use a narrowband optical filter to slice out a small portion of the total power of the light source at the center or flanks of the broadband spectrum. Furthermore, when the control parameter used for feedback control by the wavemeter involves taking the difference PD1-PD2, this difference will ideally be zero for ideal balancing when the edge filter cross-over wavelength is set initially to coincide with the mean wavelength of the source's output spectrum. A large relative signal change in this difference signal will then occur responsive to the instantaneous mean wavelength of the light source drifting off to either shorter or longer wavelengths.

For an optical spectrum that has a symmetric spectral shape along the wavelength axis, the mean wavelength will coincide with the center wavelength of the spectrum, as shown in FIG. 10a. However, for a broadband optical spectrum that is not symmetric along the wavelength axis, which is often the case for SLDs and SOAs, the mean wavelength might smaller than the center wavelength, as shown in FIG. 11a, or it might be larger than the center wavelength, as shown in FIG. 11b. Therefore, one major benefit of embodiments of this invention is the flexibility of optimizing optical characteristics of the edge filter relative to the spectral shape of the broadband light source, for example by modifying the design or by adjusting the alignment of the edge filter such that the cross-over wavelength of the edge filter coincides with the mean wavelength of the broadband spectrum.

Figure 12A:
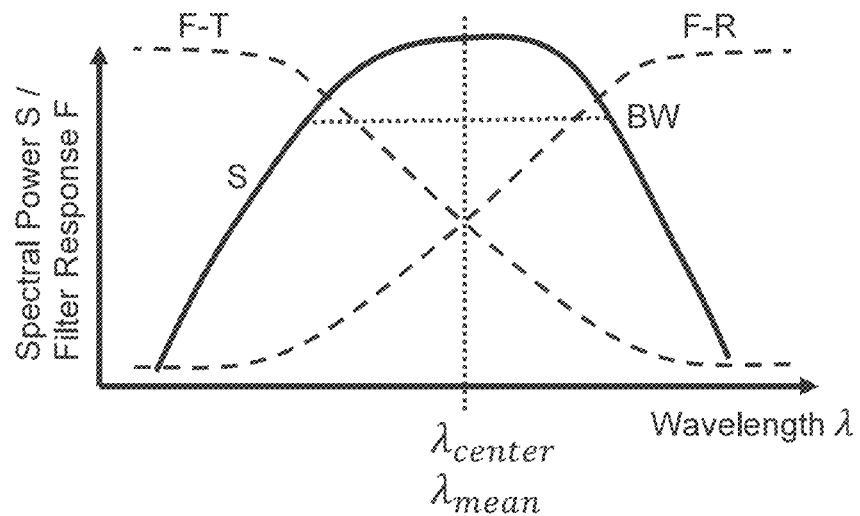
FIGS. 12a and 12b are schematic graphs of an optical output spectrum of the broadband light source and of the spectral filter characteristics of the optical edge filter, according to embodiments of the invention, where the optical edge filter has a gentle slope or a steep slope for the transition from reflection to transmission band.
Figure 12B:
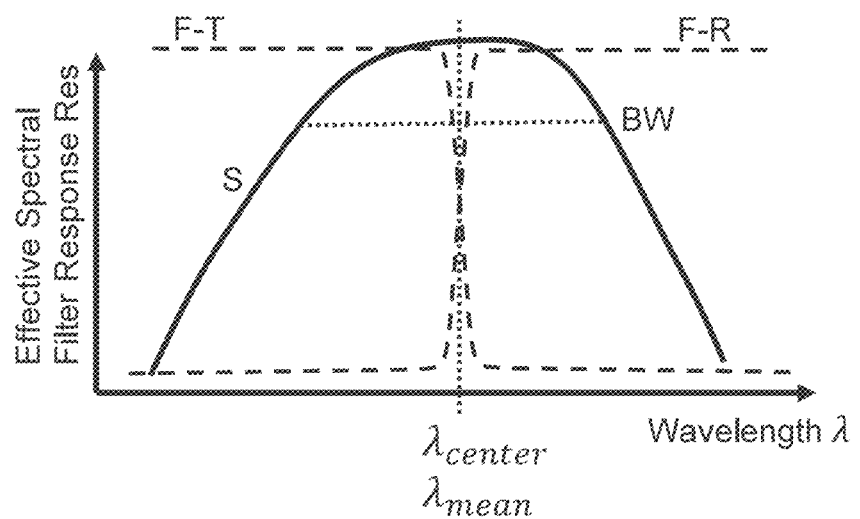

FIGS. 12a and 12b provide two more examples of different edge filter designs. Similar to FIG. 10a, the cross-over wavelength of the edge filter is aligned with the mean wavelength of the broadband light source. Because of the symmetric shape of the broadband spectrum along the wavelength axis, the mean wavelength and thus the cross-over wavelength of the edge filter also coincide with the center wavelength of the broadband spectrum. Compared to FIG. 10a, the edge filter shown in FIG. 12a has a shallower slope for the transmission response F-T and for the reflection response F-R around the cross-over wavelength. In other words, the transition range of the edge filter of FIG. 12a is larger than for the one shown in FIG. 10a. The edge filter shown in FIG. 12b, however, has a steeper slope than that of FIG. 10a for the transmission response F-T and for the reflection response F-R around the cross-over wavelength. In other words, the transition range of the edge filter of FIG. 12b is smaller than that of FIG. 10a. For use in an optical wavemeter according to this invention, the edge filter shown in FIG. 12a will have a smaller wavelength sensitivity compared to the edge filter shown in FIG. 10a, which will have a smaller wavelength sensitivity compared to the edge filter shown in FIG. 12b. In other words, the smaller the transition range of the edge filter the larger the wavelength sensitivity of the optical wavemeter. The wavelength sensitivity of the optical wavemeter could be defined as a relative signal change of its output control signal for a given wavelength change or wavelength drift of the broadband spectrum. For high-precision applications where only small wavelength changes can be tolerated, the optical wavemeter requires to have a high wavelength sensitivity because even very small wavelength changes on the order of a few ppm shall already generate a sufficiently large control signal to readjust the broadband light source.

Figure 13A:
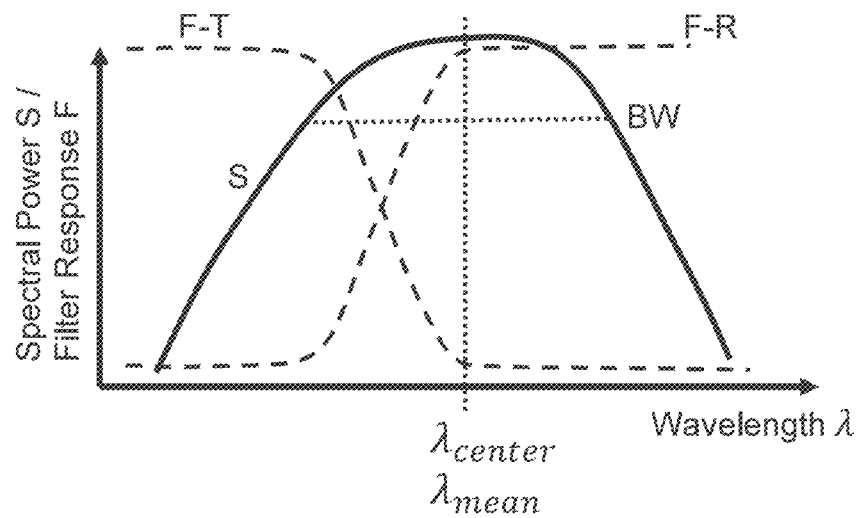
FIGS. 13a and 13b are schematic graphs of an optical output spectrum of the broadband light source and of the spectral filter characteristics of the optical edge filter, according to embodiments of the invention, where the optical edge filter is not aligned with the mean wavelength of the broadband spectrum.
Figure 13B:
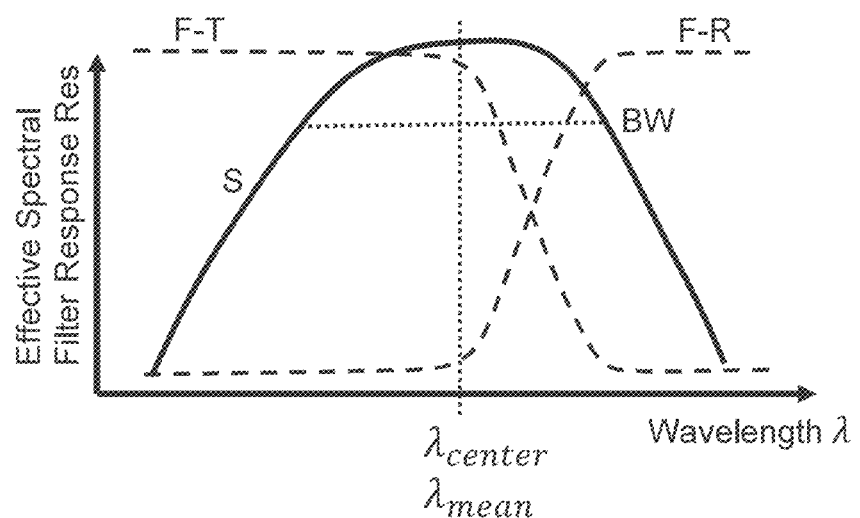

FIGS. 13a and 13b provide two more examples of different edge filter designs or different edge filter alignments. For both cases, the spectral transition ranges for transmission and reflection band are identical. In FIG. 13a, the cross-over wavelength of the edge filter is not aligned with the mean wavelength of the broadband optical spectrum but is found at a shorter wavelength. Consequently, the response of the edge filter and thus the wavelength sensitivity of the wavemeter is reduced compared to the example of FIG. 10a where an edge filter with the same transition range is aligned with the mean wavelength of the optical spectrum. Similarly, in FIG. 13b, the cross-over wavelength of the edge filter is not aligned with the mean wavelength of the optical spectrum but is found at a longer wavelength, which also results in a reduced wavelength sensitivity of the wavemeter compared to the example of FIG. 10a.

With reference to FIGS. 10 to 13, it will therefore be understood why it is advantageous for improved wavelength stabilization to select the transition range of the optical edge filter so that it is approximately equal to or less than the source bandwidth. The relevant source bandwidth is that of the light received by the optical edge filter. This distinction is relevant in embodiments as described further below where a broadband bandpass filter is used to clip and reshape the output spectrum output from the broadband semiconductor light source, if the broadband bandpass filter is arranged before the optical edge filter. Specifically, the transition range of the optical edge filter may be less than a fraction of the bandwidth of the broadband optical source light as received at the optical edge filter, wherein said fraction is one of: unity, a half, a third, a quarter (25%), a fifth (20%), a tenth (10%), 5%, 4%, 3%, 2% or 1%.

Within a suitable feedback control loop, as described further below, the optical edge filter 460 and the first and second photodetectors 494 and 495 collectively form the key components of a wavemeter to allow active wavelength (and power) stabilization of the output beam O.

A suitable edge filter may be fabricated by depositing alternating layers of first and second dielectric materials as a coating on a suitable substrate material, such as an optical glass. The number of repeats of the first and second layers may typically be in the range 10 to 25. Each layer has an effective thickness of one quarter wavelength of the cross-over wavelength, where these thickness values will be different for the two dielectric materials to take account of their different refractive index values at the cross-over wavelength. The effective thicknesses will also need to take account of the tilt angle of the edge filter layers to the incoming beam to be filtered, e.g. at a 45° tilt to the incoming beam the layers will need to be somewhat less than √2 times thicker with the reduction taking account of Snell's law. Suitable dielectric materials are, for example, oxides, such as SiO2, TiO2, Al2O3 and Ta2O5, or fluorides, such as MgF2, LaF3 and AlF3, or nitrides, such as SiN, AlN, or other compounds. A specific suitable dielectric material pairing is TiO2/SiO2 which can be used to achieve a cross-over wavelength anywhere in the range of 300-1000 nm.

The illustrated broadband light source module 100, shown in FIG. 9, is also configured as an optical transceiver in that a receiver photodetector 193 is integrated inside the light source module 100 to detect light that has traveled backwards from an external fiber link, such as a FOG or a FOCS, through the optical fiber 102. After transmission through the focusing lens 140, this back-traveling light beam is reflected by the optical beamsplitter 180 onto the receiver photodetector 193. In cases that the backward-traveling light from the external fiber link has the same polarization orientation as the forward-traveling light being output, then the beamsplitter 180 is typically a regular beamsplitter with a fixed splitting ratio, for example of 50:50 or 30:70 or 80:20, meaning that a certain percentage of the received light is reflected while the remaining part is transmitted. On the other hand, in cases that the backward-traveling light from the external fiber link has a polarization orientation that is rotated by 90° relative to that of the forward-traveling light from the broadband semiconductor light source, then the beamsplitter 180 can be realized as a polarizing beamsplitter (PBS), to reduce insertion losses for the optical beams in both the forward and backward directions.

Figure 14:
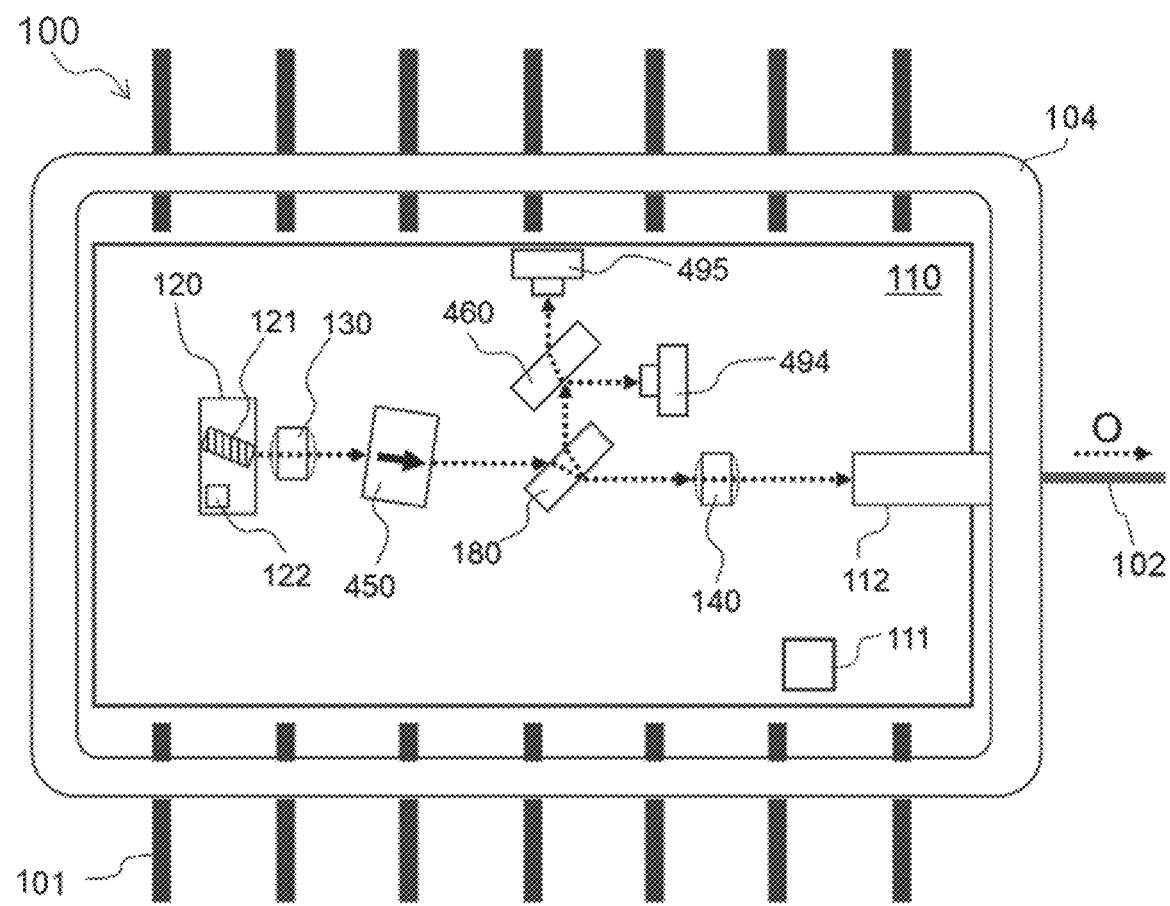
FIGS. 14 to 17 are schematic plan views of light source modules according to further embodiments of the invention.

FIG. 14 is a schematic drawing of a light source module 100 according to another embodiment of the invention. Here, compared to the embodiment of FIG. 9, the optical light source module does not incorporate a receiver photodiode for transceiver operation. Moreover, compared to the embodiment of FIG. 9, a broadband optical isolator 450 is provided in place of a polarization filter. The optical isolator 450 could also be placed after the beamsplitter 180 rather than before it as illustrated. The optical isolator 450 prevents the broadband semiconductor light source 121 from receiving back-traveling light that is returned to the module from the external fiber link. This may prevent destabilization of the broadband semiconductor light source that might otherwise occur.

Figure 15:
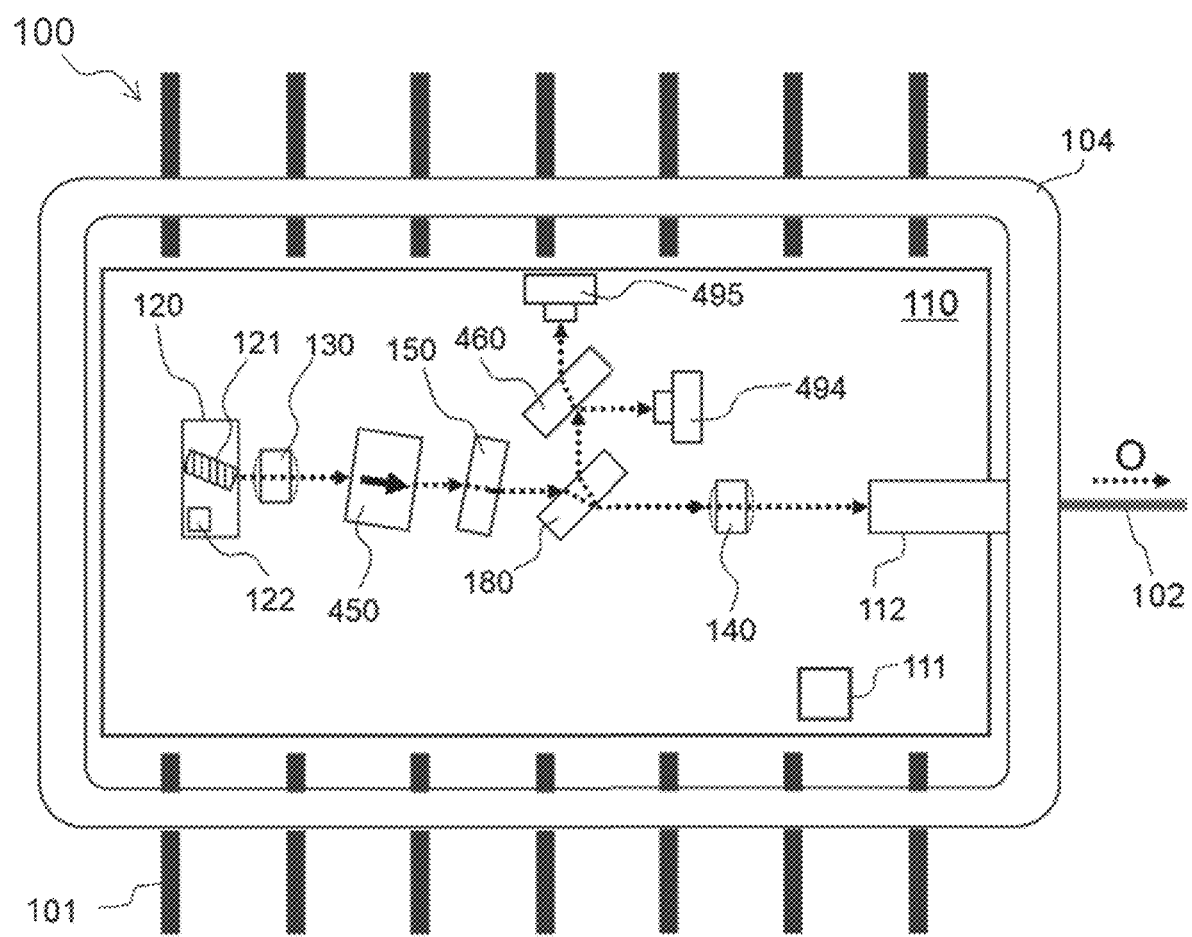

FIG. 15 is a schematic drawing of a light source module 100 according to another embodiment of the invention. Here, an additional optical filter 150 is positioned before the optical beamsplitter 180. The additional optical filter 150 can be configured as required for any particular application. In a first example, the optical filter 150 could be a broadband bandpass filter as used in Velez et al. (US2007/096042A1) to reshape the optical output spectrum of the broadband light source 121. A Gaussian spectral shape, or another preferred spectral shape, could thus be provided, e.g. such that the coherence function of the light output from the module exhibits fewer or smaller sidelobes. Another benefit of this approach is that such a broadband bandpass filter can result in an improved wavelength stabilization as the filtered spectrum reduces wavelength changes by passive wavelength stabilization separately from the active wavelength stabilization provided by the wavemeter components. A second example is to configure the optical filter 150 to reduce the bandwidth of the light output from the broadband light source 121 so that the output beam from the module is intentionally given a longer coherence length.

Further embodiments can be envisaged with both an optical isolator 450 as described herein with reference to FIGS. 14 to 17 as well as a polarization filter 250 as described in the embodiment of FIG. 9 that is placed before or after the optical filter 150.

Figure 16:
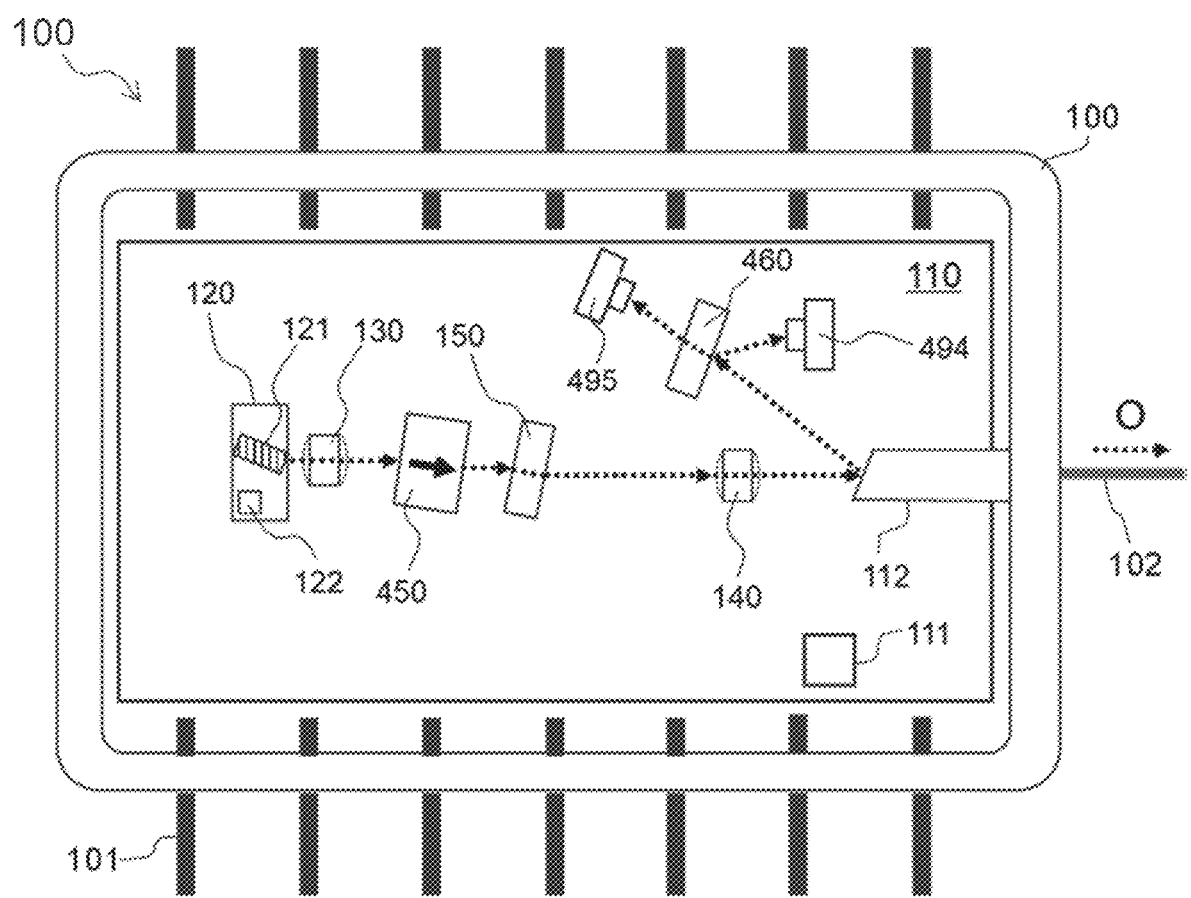

FIG. 16 is a schematic drawing of a light source module 100 according to another embodiment of the invention. Here, the optical input signal into the wavemeter is not tapped off through an optical beamsplitter but is taken from the light that is reflected or scattered from the end of the optical fiber 102 where the output light is coupled into. For this purpose, the end of the optical fiber 102 may be tilted as schematically illustrated or specularly scattered light may be used.

Figure 17:
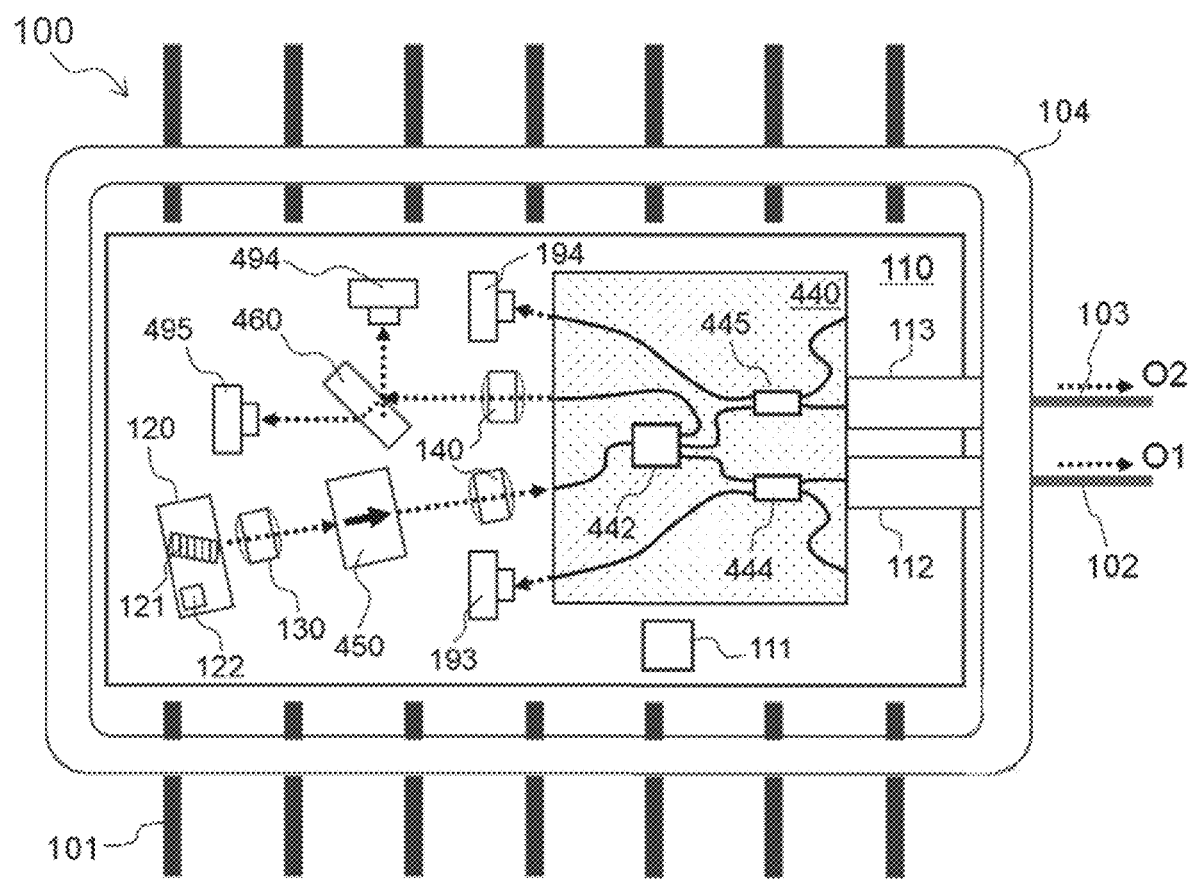

FIG. 17 is a schematic drawing of a light source module 100 according to another embodiment of the invention. Here, the light source module has first and second optical fibers, namely a first optical fiber 102 for a first output beam O1 and a second optical fiber 103 for a second output beam O2. The optical fibers 102, 103 may be single-mode fibers or multi-mode fibers and may also be polarization-maintaining fibers (or not). The optical fibers 102, 103 have their ends located in respective ferrules 112, 113 which are in turn mounted on the optical bench 110 or in the housing end wall. The light source module 100 incorporates a Photonic Integrated Circuit (PIC) chip 440. The PIC chip 440 may be realized with Silicon photonics or with LiNbO3 or with semiconductor compounds based on GaAs, GaN or InP or other suitable material systems. The PIC chip 440 incorporates a plurality of optical waveguides providing waveguiding paths for the source output beam and also back-traveling light received by the module. The PIC chip 440 further incorporates a plurality of optical couplers or splitters and may also incorporate other passive or active optical elements such as etched pockets, integrated lenses, integrated filters, grating structures, phase or amplitude modulators, photodetectors, or even light sources. In the example shown in FIG. 17, the light source module 100 represents an optical transceiver module with two output optical fibers 102, 103. The divergent light output from the broadband light source chip 121 is collimated by a collimation lens 130, transmitted through an optical isolator and coupled into an optical waveguide of the PIC chip 440 through a focusing lens 140. The light injected into the PIC chip 440 is received by a first stage 1×3 coupler 442 that splits the input light into three output waveguides, a first one for transmitting light to the integrated wavemeter 140, 460, 494, 495 and second and third ones which transmit light to respective second stage 2×2 couplers 444, 445 that each split the input light beam into two output light beams, namely a first beam propagating towards the respective output optical fiber 102, 103 and a second beam that propagates outside the PIC chip 440. Light signals received from an external fiber link through either optical fiber 102 or 103 travel backwards into the PIC chip 400, through the associated 2×2 coupler 444, 445 and are output from the PIC chip 440 to receiver photodetectors 193 and 194. As in previous embodiments, the optical wavemeter is realized with an optical edge filter 460 that reflects one portion of the broadband light source's optical output spectrum to a first (wavemeter) photodetector 494 and that transmits the remaining portion to a second (wavemeter) photodetector 495. If an optical transceiver functionality is not needed, it will be understood that the second stage 2-way couplers would be omitted from the PIC chip 440 as well as the receiver photodetectors 193, 194.

It will be understood that while the embodiment of FIG. 17 shows a PIC chip suitable for providing two outputs for two optical fibers, further embodiments are readily envisaged with a PIC chip for providing three, four, five, six or more outputs for a corresponding number of optical fibers.

It will also be understood that an optical light source module 100 with two, three or more output optical fibers can also be realized without an integrated PIC chip solely based on standard discrete optical components, such as splitters and beam dividers.

Figure 18A:
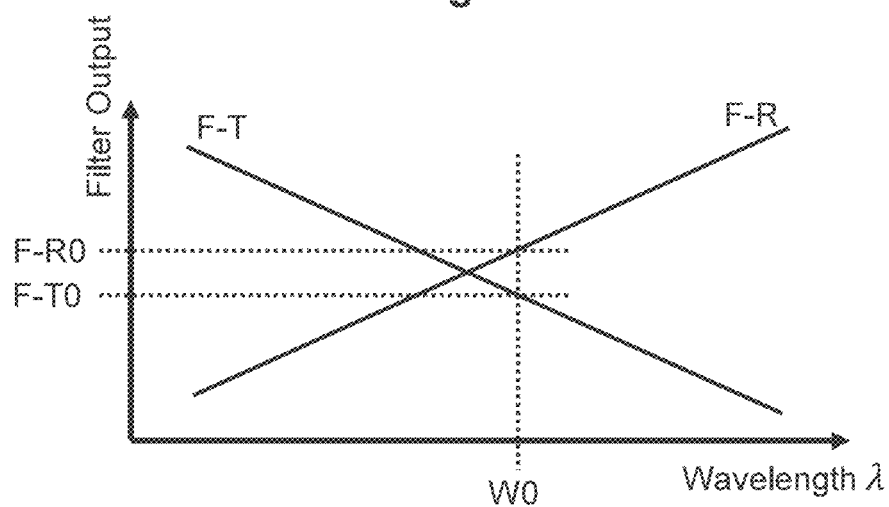
FIGS. 18a and 18b are schematic drawings of the edge filter response in transmission and reflection as a function of the light source's wavelength or power change according to embodiments of the invention.
Figure 18B:
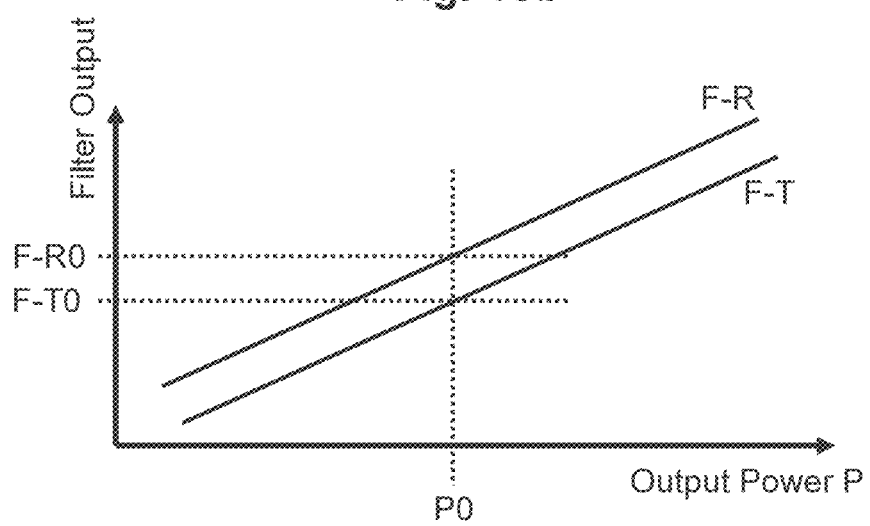

FIGS. 18a and 18b are highly schematic drawings of the edge filter response in transmission and reflection as a function of the light source's wavelength (FIG. 18a) or output power (FIG. 18b) according to any of the above-described embodiments of the invention which are included to show the general behavior of the module. The real response curves will have a functional form that depends on the edge filter characteristics and possibly also on the spectral shape of the broadband light source.

FIG. 18a shows an example response for an edge filter that transmits the short-wavelength portion of the output spectrum and reflects the long-wavelength portion of the output spectrum. Consequently, the filter response F-T for the transmitted portion increases for wavelength shifts towards shorter wavelengths and decreases for wavelength shifts towards longer wavelengths. On the other hand, the filter response F-R for the reflected portion increases for wavelength shifts towards longer wavelengths and decreases for wavelength shifts towards shorter wavelengths. As shown in FIG. 18a, at a reference wavelength position W0, for example the initial (uncontrolled) or target (controlled) mean wavelength of the broadband light source, the corresponding filter response signals will be F-R0 and F-T0, respectively, which may not necessarily have the same value. As indicated by FIG. 18a, the two response signals F-T and F-R of the optical edge filter have opposite slopes, which allows positive (red) wavelength shifts to be distinguished from negative (blue) wavelength shifts.

FIG. 18b shows how the two response signals F-T and F-R of the optical edge filter will change with changing optical output power of the broadband light source. As indicated, both response signals will change in a similar direction and by an amount which is proportional to the change in output power. As shown in FIG. 18b, at a reference power level P0, for example the initial (uncontrolled) or target (controlled) power level of the broadband light source, the corresponding filter response signals will be F-R0 and F-T0, respectively, which preferably have the same or similar values. The relative magnitudes of F-R0 and F-T0 can be tuned during assembly of the module when the optical edge filter is placed in the free-space beam path. Namely, it is possible to tune the spectral responses Res-T and Res-R by changing the placement of the filter, e.g. by making small increments in its rotation angle relative to the optical axis of the light beam or its tilt angle relative to the optical axis of the light beam. This tuning can be used to ensure the filter outputs F-R and F-T are equal or close in power (F-R0≈F-T0), which helps improve the wavelength sensitivity of the wavemeter.

In summary of the above embodiments, the proposed architecture of the invention, which is based on an optical edge filter with its cross-over wavelength placed at or near the mean wavelength of the broadband semiconductor light source's output spectrum in combination with two detectors for receiving the short- and long-wavelength halves of the output spectrum transmitted and reflected by the optical edge filter, is able to differentiate between both power changes and wavelength changes in the output spectrum of the broadband light source. The light intensities transmitted and reflected from an optical edge filter, as measured by the respective photodetectors and output as electric signals as feedback control parameters to a suitable controller (described further below), are highly sensitive to small wavelength changes. High wavelength sensitivity of the feedback control parameter is key to achieving an ultra-stable broadband light source, e.g. with wavelength changes of less than ±50 ppm over time and temperature. With embodiments of the invention, it is possible to provide a wavemeter that is sensitive enough to detect very small wavelength changes, for example of ±5 ppm, ±10 ppm, ±15 ppm, ±20 ppm, ±25 ppm, ±30 ppm, ±35 ppm, ±40 ppm, ±45 ppm and ±50 ppm.

Figure 19:
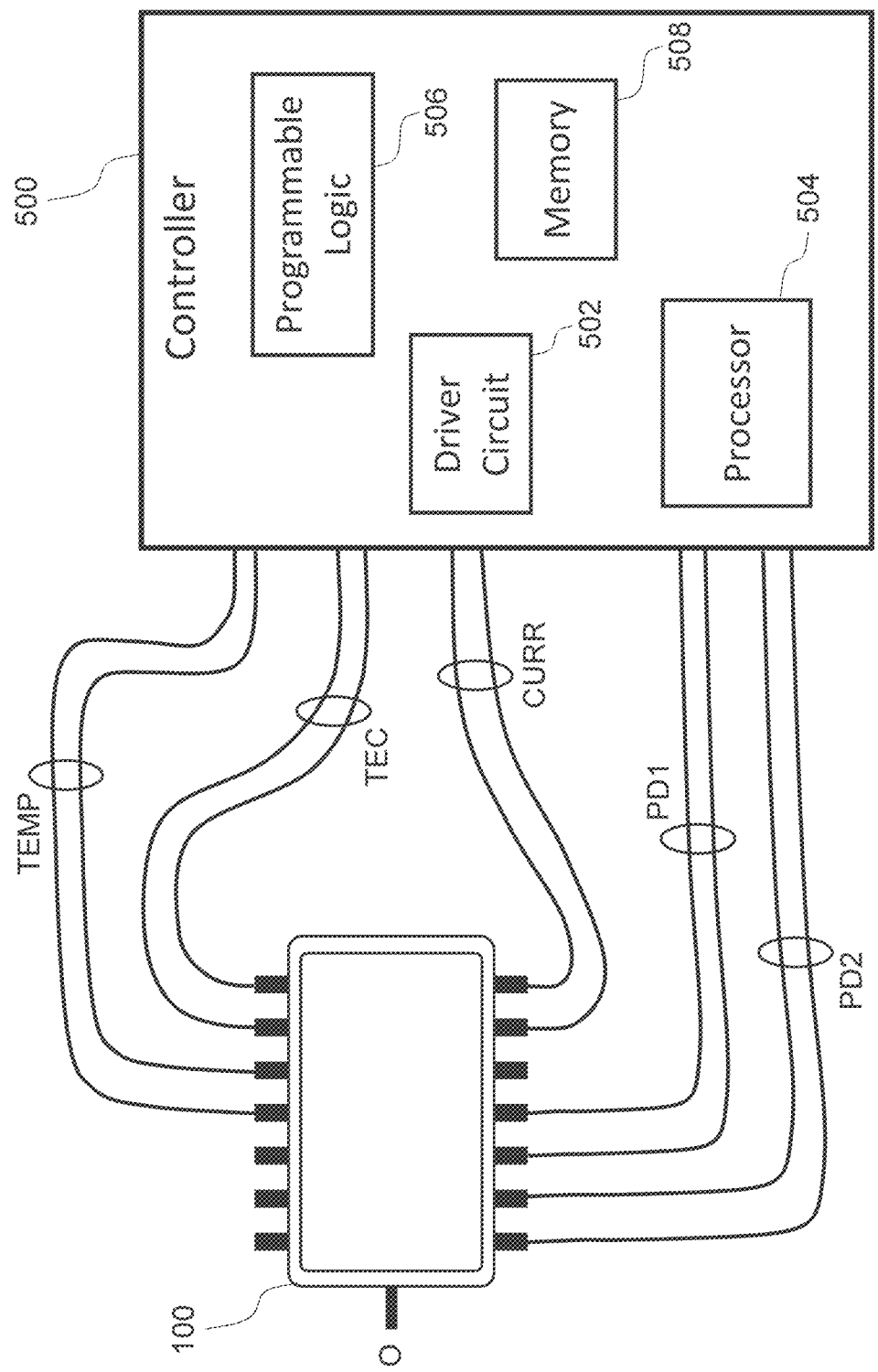
FIG. 19 is a schematic drawing of an integrated light source module according to embodiments of the invention when being operated, monitored and controlled by an external controlling unit.

FIG. 19 shows an arrangement of a light source module 100 according to any of the above-described embodiments of the invention in combination with a controller 500. The controller 500 may read in an electrical current or voltage signal TEMP from an integrated temperature sensor, for example a negative temperature coefficient (NTC) semiconductor sensor or a positive temperature coefficient sensor like a Pt100 or Pt1000 metal sensor. The controller 500 may generate an electrical voltage or current for the integrated thermo-electric Peltier cooler (TEC) that is, dependent on the sign of the current, either cooling or heating the TEC and the optical bench inside the optical light source module 100. The controller 500 includes a driver circuit 502 operable to generate a drive current CURR for the broadband semiconductor light source. Alternatively, the driver circuit 502 may generate a drive voltage for the broadband semiconductor light source, e.g. using a digital-to-analog converter (DAC), which is converted into a drive current by an additional current source circuit. The controller 500 receives electrical current or voltage signals from the two detectors PD1 and PD2 of the integrated wavemeter and incorporates a processor 504 to determine a control parameter from PD1 and PD2 for use in the control loop for stabilizing the mean wavelength of the broadband light source through adjustment of the drive current, for example. The controller 500 further comprises programmable logic 506, for example an application specific integrated circuit (ASIC), programmable logic array (PLA), or field programmable gate array (FPGA) for incorporating control logic. The controller 500 further comprises a memory 508 to provide storage for instructions and data for control programs for wavelength and power stabilization that are executable on the processor 504. The memory 508 is typically semiconductor-based memory such as dynamic random access memory (DRAM) and/or static random access memory (SRAM).

Maximum sensitivity is achieved when the electrical outputs PD1 and PD2 from the photodetectors are combined into a composite parameter by control logic of the controller 500, this composite parameter being used as the feedback parameter for controlling the wavelength characteristics of the output spectrum output by the broadband light source, most especially the mean wavelength.

One example composite parameter is the ratio of the two electrical outputs, i.e. PD1/PD2, which will increase for wavelength changes towards shorter wavelengths and decrease for wavelength changes towards longer wavelengths (or vice versa) depending on whether the optical edge filter is a SWP or LWP filter.

Another example composite parameter is the ratio of the difference and sums of the two electrical outputs, i.e. (PD1−

PD2)/(PD1+PD2). Here, the denominator (PD1+PD2) represents the total output power of the broadband light source. Therefore, this ratio is a power-independent control signal that is solely indicative of a wavelength change.

Alternatively, for wavelength control, the controller may calculate a power function or an exponential function or any other mathematical function of the two detector readings PD1 and PD2 to arrive at a control signal that is, ideally, independent of the light source's output power and that is indicative of wavelength changes in the output of the broadband light source with sufficiently high sensitivity.

For power control, the feedback parameter can be either PD1, PD2 or the sum PD1+PD2, for example.

Furthermore, the controller 500 may also, from time to time, during the lifetime of the device perform a calibration of both detector readings PD1 and PD2, for example by subtracting or otherwise considering known offset values of these readings. Finally, the controller may actively stabilize the broadband light source, for example in terms of output power or in terms of mean wavelength or more likely both, by adjusting the operating point of the injection current CURR passed through the broadband semiconductor light source and the operating point of the temperature TEMP to be maintained at the source's temperature sensor (as a proxy for active region temperature in the source).

Figure 20A:
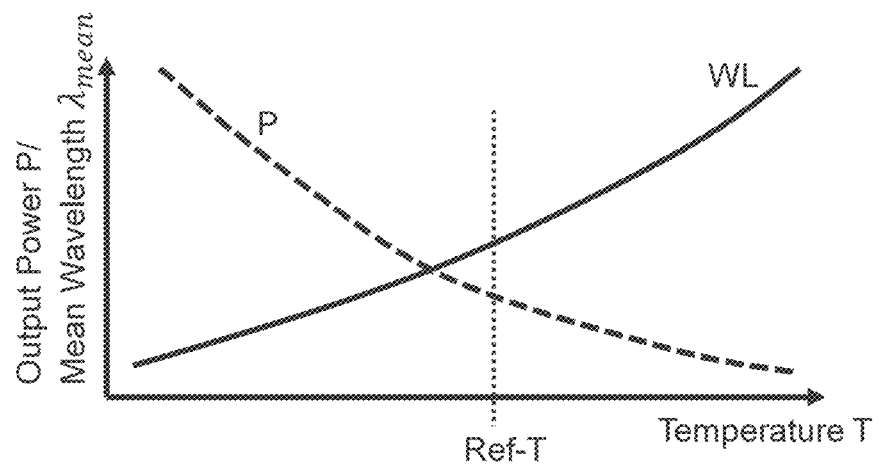
FIGS. 20a and 20b are schematic drawings of how the output power and mean wavelength of a broadband semiconductor light source may change with temperature or with injection current.
Figure 20B:
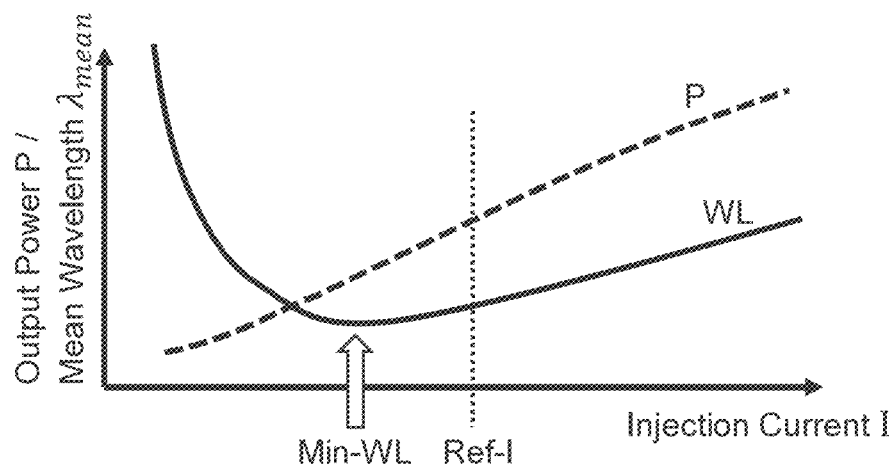

FIGS. 20a and 20b are schematic graphs showing how the output power and mean wavelength of a broadband semiconductor light source, such as an SLD or an SOA, may change with temperature and injection current respectively.

FIG. 20a plots the variation of output power P and mean wavelength WL as a function of temperature of the broadband semiconductor light source for an arbitrary fixed value of injection current. The graph shows that the optical output power P decreases with increasing temperature, while the mean wavelength WL increases with increasing temperature. The reference line at temperature Ref-T is discussed below.

FIG. 20b plots the variation of output power P and mean wavelength WL as a function of injection current passing through the broadband semiconductor light source for an arbitrary fixed value of ambient temperature. The graph shows that the optical output power P increases with increasing injection current. As an aside, it is noted this is true within the normal operating regime envisaged for the broadband semiconductor light source in this invention noting that, although the output power P may eventually decrease at very large currents close to thermal roll-over (not shown), this is not relevant for the present purposes, since the broadband light source will not be operated there. The graph shows a non-monotonic behavior for mean wavelength WL as a function of injection current, which is caused by the interplay between two physical effects. Carrier distribution changes in the semiconductor active region as injection current increases. Namely, increased band-filling from the valence to the conduction band takes place along with changes in the Fermi distribution and these changes act to shorten the emission wavelength. On the other hand, increased injection current increases the local temperature within the active region of the broadband semiconductor light source, which in turn reduces the semiconductor bandgap and thus acts to lengthen the emission wavelength. Usually, there is a crossing point of these two effects so that a minimum occurs in the mean wavelength at a certain intermediate value of injection current, labeled Min-WL. The injection current at which the minimum in the injection current occurs at any particular temperature will depend on the specification of the semiconductor heterostructure of the broadband semiconductor light source, such as specific details of the epitaxial structure, specific details of the chip design and its manufacturing processes. For certain applications, such as for high-precision FOG applications, it might be desirable to operate the broadband semiconductor light source near this minimum of the mean wavelength curve as this would keep any changes in mean wavelength over time to a minimum. FIGS. 20a and 20b also show reference values of temperature and injection current, labeled Ref-T and Ref-I, which indicate the operating point where the broadband semiconductor light source is being operated under control of the controller.

Figure 21:
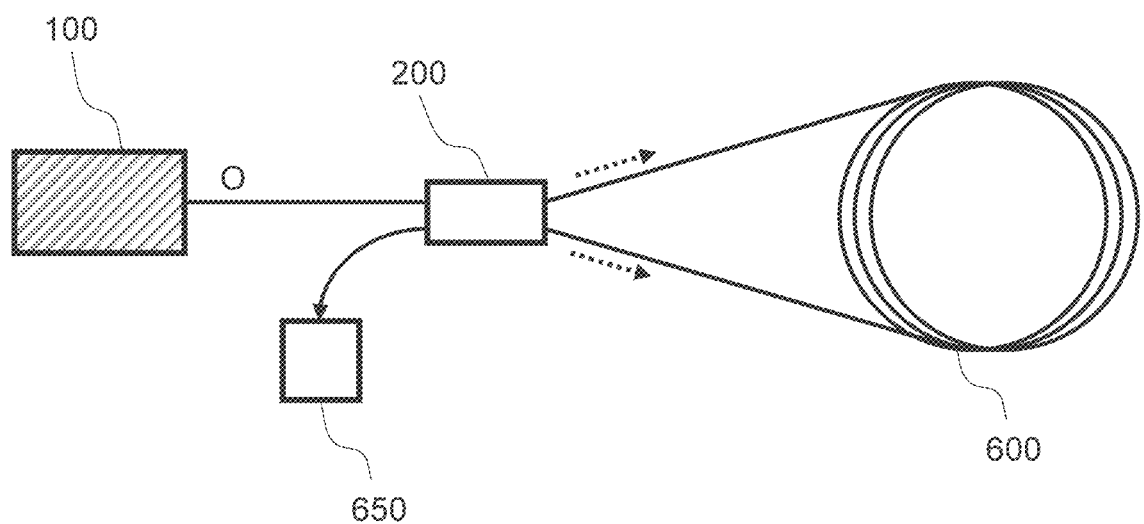
FIG. 21 is an example of an optical sensor with an interferometric fiber loop that is connected to a light source module according to embodiments of the invention.

FIG. 21 shows an example of an optical sensor with an interferometric fiber loop that is connected to a light source module according to any embodiment of the invention. Here, the light source module 100 and its output O is connected in optical communication with an optical coupler 200. The optical coupler 200 has first and second outputs that are connected to either end of a fiber loop mirror, for example a Sagnac interferometer. Such a configuration is typical for FOGs where the broadband light output from the light source module is split into two counter-propagating waves that travel through this fiber loop minor in opposite directions. After one round-trip through the loop and upon arrival at the coupler 200, the two signals will have experienced a phase delay relative to each other whose magnitude is proportional to the angular rotation speed of the FOG sensor. The interference of the signals and their phase delay can be detected with a suitable receiver 650 that is connected to the coupler 200.

It will also be readily understood how a FOCS or a FBG sensor may be constructed that incorporates a light source module according to the invention.

Various changes may be readily considered by the skilled person to the above-described embodiments.

Instead of using optical fiber(s) as the output elements from the module, as shown in all the illustrated embodiments, the output could be of a free-space beam, in which case the output element could be a window, e.g. arranged in an end wall of the module housing.

The broadband semiconductor light source principally considered of interest for embodiments of the invention is a SLD broadband semiconductor light source. The above embodiments use a single SLD. In other embodiments multiple SLDs may be used as the broadband semiconductor light source. The individual SLDs of the multiple SLD source may either be specified to be the same to provide more power and/or redundancy, i.e. each to have the same optical output spectrum, or to have overlapping optical output spectra to provide a broader continuous emission range, e.g. as disclosed by Dülk et al (US2020/192017A1) In other embodiments, the broadband semiconductor light source is a combined SLD and SOA, e.g. as disclosed by Dülk (US2020/251610A1) or Oh & Hu (US2009/154514A1). The invention may also be applied to a SOA as the broadband semiconductor light source. The broadband semiconductor light source may also be two or more SOAs arranged in series, e.g. as disclosed by DiJaili et al (US 2004/017604A1) or an SOA pumped by an erbium doped fiber amplifier, e.g. as disclosed by Hakimi et al (US2014/153083A1). If multiple broadband semiconductor light sources are used together in a light source module, their outputs may be individually controlled by multiple sets of the above-described wavemeter components and suitably adapted control electronics. On the other hand, such multiple broadband semiconductor light sources could have their aggregate combined output controlled by a single set of wavemeter components as described above together with the same control electronics.

The bandwidth of an individual broadband semiconductor light source such as an SLD or SOA is defined by a variety of design parameters, including its epitaxial semiconductor stack structure and materials, the dimensions of the ridge in the case of a ridge structure, and the properties of the chip's end facets. The bandwidth, as defined further above, scales with the square of wavelength for comparable designs, so the maximum possible bandwidth for comparable designs increases for longer wavelengths. The bandwidth covered by an individual broadband semiconductor light source as disclosed herein may have any value between 3 nm and 160 nm. With current technology and using the arsenide- and phosphide-based materials system bandwidths of up to about 160 nm are achievable in SLDs with mean wavelengths in the near infrared (NIR) and infrared (IR). With current technology and using the nitride-based materials system bandwidths of up to 30 nm are achievable in blue and green SLDs. For example, the bandwidth may have a value of 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 60, 70, 80, 90, 100, 110, 120, 130, 140 or 150 nm.

While the TEC has been described in terms of cooling the optical bench, it will be understood that a TEC based on a Peltier element can be used either to heat or cool as required. For example, in space, e.g. when the module is mounted in a satellite, heating may be needed as well as cooling depending on whether the module is in the sun's rays or shadow.

What is claimed is:

1. A light source module comprising:
   a broadband semiconductor light source configured to emit an output beam whose power is distributed over an output spectrum which defines a bandwidth;
   an optical edge filter arranged to receive a portion of the output beam and divide it by transmission and reflection into short-wavelength and long-wavelength components, where the optical edge filter has a transition range over which the amount of the received portion of the output beam transmitted relative to the amount reflected by the optical edge filter varies as a function of wavelength over at least a portion of the bandwidth of the broadband semiconductor light source including a cross-over wavelength at which the amount of the output beam transmitted and reflected is equal;
   first and second photodetectors each arranged to receive one of the wavelength components reflected and transmitted by the optical edge filter and configured to output respective first and second photodetector signals indicative of the power of the wavelength component received; and
   an output element through which the output beam exits the light source module.

2. The module of claim 1, wherein the edge filter is one of: a long-wave pass filter configured to reflect the short-wavelength component and transmit the long-wavelength component; and a short-wave pass filter configured to reflect the long-wavelength component and to transmit the short-wavelength component.

3. The module of claim 1, wherein the output element is at least one optical fiber, the or each optical fiber having an end into which the output beam is coupled.

4. The module of claim 3, further comprising an additional photodetector arranged to receive light that has traveled backwards into the light source module through the optical fiber.

5. The module of claim 3, wherein said portion of the output beam received by the optical edge filter is obtained by scattering from said end of the optical fiber.

6. The module of claim 1, further comprising a beamsplitter arranged to tap off said portion of the output beam for the optical edge filter.

7. The module of claim 1, further comprising a broadband bandpass filter having a bandpass spectrum configured to fit within the output spectrum of the broadband semiconductor light source and thereby clip and reshape the latter, the broadband bandpass filter being arranged in the path of the output beam.

8. The module of claim 1, wherein the broadband semiconductor light source comprises at least one of a superluminescent diode and a semiconductor optical amplifier.

9. The module of claim 1, wherein the cross-over wavelength of the optical edge filter coincides with a mean wavelength of the output spectrum of the broadband semiconductor light source that is attainable in normal operation of the broadband semiconductor light source.

10. The module of claim 1, wherein the transition range of the optical edge filter is less than a fraction of the bandwidth of the broadband optical source light as received at the optical edge filter, wherein said fraction is one of: unity, a half, a third, a quarter, a fifth, a tenth (10%), 5%, 4%, 3%, 2% or 1%.

11. The module of claim 1, further comprising a photonic integrated circuit chip comprising waveguiding paths arranged to convey the output beam emitted from the broadband semiconductor light source between components of the module including one or more of the broadband semiconductor light source, the optical edge filter, the first photodetector, the second photodetector and the output element.

12. The module of claim 1, further comprising:
    a substrate on which components of the light source module are mounted, including at least the broadband semiconductor light source;
    a temperature sensor arranged in thermal contact with the substrate to provide a substrate temperature signal indicative of the substrate temperature;
    a heating/cooling element arranged in thermal contact with the substrate in order to heat/cool the substrate.

13. The module of claim 12, further comprising a controller that is configured to operate the broadband semiconductor light source at operating points of source drive current and source temperature which together maintain the mean wavelength at a constant value according to a control parameter determined from at least one of the first and second photodetector signals output by the first and second photodetectors, wherein the controller is configured to maintain the substrate at a constant temperature as indicated by the substrate temperature signal.

14. The module of claim 1, further comprising:
    a temperature sensor arranged adjacent the broadband semiconductor light source to provide a source temperature signal that tracks temperature changes of the broadband semiconductor light source in operation.

15. The module of claim 14, further comprising a controller that is configured to operate the broadband semiconductor light source at operating points of source drive current and source temperature which together maintain the mean wavelength at a constant value according to a control parameter determined from at least one of the first and second photodetector signals output by the first and second photodetectors, wherein the controller is configured to adjust the drive current operating point through adjustment of drive current supplied to the broadband semiconductor light source, and wherein the controller is configured to adjust the source temperature operating point by maintaining the source temperature signal at a constant value.

16. The module of claim 1, further comprising a controller that is configured to operate the broadband semiconductor light source at operating points of source drive current and source temperature which together maintain the mean wavelength at a constant value according to a control parameter determined from at least one of the first and second photodetector signals output by the first and second photodetectors.

17. The module of claim 16, wherein the control parameter includes one of: a ratio of the first and second photodetector signals; a ratio between the difference and the sum of the first and second photodetector signals; and another mathematical function using both the first and second photodetector signals as variable operands.

18. The module of claim 16, wherein the controller is further configured to operate the broadband semiconductor light source to provide constant output power.

19. The module of claim 1, where cross-over wavelength lies within the bandwidth of the broadband semiconductor light source.

20. An optical fiber sensor system comprising:
a broadband semiconductor light source configured to emit an output beam whose power is distributed over an output spectrum which defines a bandwidth;
an optical edge filter arranged to receive a portion of the output beam and divide it by transmission and reflection into short-wavelength and long-wavelength components, where the optical edge filter has a transition range over which the amount of the received portion of the output beam transmitted relative to the amount reflected by the optical edge filter varies as a function of wavelength over at least a portion of the bandwidth of the broadband semiconductor light source including a cross-over wavelength at which the amount of the output beam transmitted and reflected is equal;
first and second photodetectors each arranged to receive one of the wavelength components reflected and transmitted by the optical edge filter and configured to output respective first and second photodetector signals indicative of the power of the wavelength component received; and
an output element,
wherein the broadband semiconductor light source, the optical edge filter, the first and second photodetectors and the output element form a light source module, and
wherein the output beam exits the light source module through the output element, and the system further comprising:
an optical fiber providing a sensing function in optical communication with the output element so as to receive light from the output beam.

* * * * *